United States Patent
Cai et al.

(10) Patent No.: US 11,822,388 B2
(45) Date of Patent: Nov. 21, 2023

(54) SUPPORT BACKPLATE AND METHOD FOR MANUFACTURING THE SAME, AND FOLDABLE DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yangyang Cai, Beijing (CN); Binfeng Feng, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 16 days.

(21) Appl. No.: 17/231,110

(22) Filed: Apr. 15, 2021

(65) Prior Publication Data
US 2021/0325929 A1    Oct. 21, 2021

(30) Foreign Application Priority Data
Apr. 17, 2020    (CN) .......................... 202010307788.6

(51) Int. Cl.
*G06F 1/16*    (2006.01)
*B32B 3/26*    (2006.01)
(Continued)

(52) U.S. Cl.
CPC ............ *G06F 1/1652* (2013.01); *B32B 3/263* (2013.01); *B32B 7/12* (2013.01); *B32B 38/0004* (2013.01); *B32B 2457/20* (2013.01)

(58) Field of Classification Search
CPC ......... G06F 1/1652; B32B 3/263; B32B 7/12; B32B 38/0004; B32B 2457/20;
(Continued)

(56) References Cited

U.S. PATENT DOCUMENTS

2015/0043174 A1*  2/2015  Han ................... G02F 1/13452
                                                              428/156
2016/0139634 A1    5/2016  Cho et al.
(Continued)

FOREIGN PATENT DOCUMENTS

CN    109285459    1/2019
CN    109427248    3/2019
(Continued)

OTHER PUBLICATIONS

Chinese First Office Action (w/ English translation) for corresponding CN Application No. 202010307788.6, 18 pages.

*Primary Examiner* — Alicia J Weydemeyer
*Assistant Examiner* — Laura B Figg
(74) *Attorney, Agent, or Firm* — Dority & Manning, PA

(57) ABSTRACT

A support backplate includes a plurality of support strips and a first elastic connection layer. The plurality of support strips are arranged at intervals in a first direction, and each support strip of the plurality of support strips extends in a second direction. The first direction is perpendicular to a thickness direction of the support strip, and the second direction is substantially perpendicular to the first direction in a first plane perpendicular to the thickness direction. The first elastic connection layer is disposed on a side of the plurality of support strips in the thickness direction, and the first elastic connection layer is directly connected to the support strip.

17 Claims, 13 Drawing Sheets

(51) Int. Cl.
  *B32B 7/12*     (2006.01)
  *B32B 38/00*    (2006.01)
(58) Field of Classification Search
  CPC ....... B32B 37/12; B32B 7/02; B32B 2305/72;
                                 B32B 2310/0831
  See application file for complete search history.

(56)            References Cited

U.S. PATENT DOCUMENTS

2017/0142847 A1    5/2017  Park
2018/0217639 A1*   8/2018  Jones ................... G06F 1/1626
2021/0174709 A1    6/2021  Xiang et al.

FOREIGN PATENT DOCUMENTS

CN        208819536      5/2019
CN        209312360      8/2019

* cited by examiner

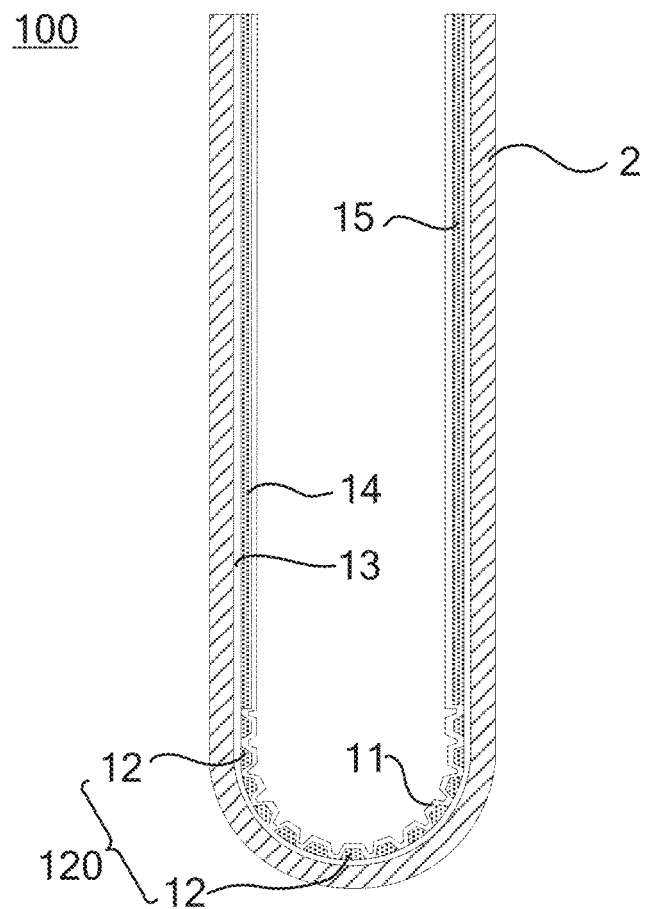

FIG. 9B

| A carrier film is provided |
|---|

↓

| The plurality of support strips are arranged on the first carrier film at intervals in the first direction |
|---|

↓

| The first elastic connection layer is formed on a side of the plurality of support strips facing away from the first carrier film, and the first elastic connection layer is connected to the support strip |
|---|

↓

| The carrier film is separated from the plurality of support strips |
|---|

FIG. 10

SUPPORT BACKPLATE AND METHOD FOR MANUFACTURING THE SAME, AND FOLDABLE DISPLAY APPARATUS

CROSS-REFERENCE TO RELATED APPLICATION

This application claims priority to Chinese Patent Application No. 202010307788.6, filed on Apr. 17, 2020, which is incorporated herein by reference in its entirety.

TECHNICAL FIELD

The present disclosure relates to the field of display technologies, and in particular, to a support backplate and a method for manufacturing the same, and a foldable display apparatus.

BACKGROUND

Flexible display products, such as flexible organic light-emitting diodes (OLEDs) may be applied to a foldable display apparatus, which makes the display apparatus have various shapes to meet requirements in different usage scenarios.

Generally, a flexible OLED display apparatus includes a flexible display panel and a support backplate that are attached together. When a shape of the flexible display panel is changed, a shape of the support backplate can also be changed accordingly. For example, the support backplate is folded or tiled along with the flexible display panel to support the flexible display panel.

SUMMARY

In one aspect, a support backplate is provided. The support backplate includes a plurality of support strips and a first elastic connection layer. The plurality of support strips are arranged at intervals in a first direction. Each support strip of the plurality of support strips extends in a second direction. The first direction is perpendicular to a thickness direction of the support strip, and the second direction is substantially perpendicular to the first direction in a first plane perpendicular to the thickness direction. The first elastic connection layer is disposed on a side of the plurality of support strips in the thickness direction and is directly connected to the support strip.

In some embodiments, in the first direction, a first distance between surfaces facing away from the first elastic connection layer of two adjacent support strips of the plurality of support strips is less than or equal to a second distance between surfaces thereof facing the first elastic connection layer.

In some embodiments, each support strip of the two adjacent support strips has a first surface perpendicular to a thickness direction of the support strip and facing away from the first elastic connection layer. Areas of first sections of the support strip parallel to the first plane progressively decrease in a third direction pointing from the first surface to the first elastic connection layer.

In some embodiments, a second section of the support strip parallel to a second plane is in a trapezoidal shape or a triangular shape, the second plane is parallel to the thickness direction of the support strip and the first direction.

In some embodiments, the first elastic connection layer extends into a gap between two adjacent support strips.

In some embodiments, a surface of the first elastic connection layer facing away from the plurality of support strips includes at least one first groove. At least one first groove is disposed between two adjacent support strips.

In some embodiments, a material of the first elastic connection layer includes at least one of organic silica gel, thermoplastic elastomer or polyvinyl chloride.

In some embodiments, the support backplate further includes a second elastic connection layer disposed on a side of the plurality of support strips facing away from the first elastic connection layer. The second elastic connection layer is directly connected to the support strip.

In some embodiments, the second elastic connection layer extends into a gap between two adjacent support strips.

In some embodiments, a surface of the second elastic connection layer facing the first elastic connection layer includes at least one second groove. The first elastic connection layer includes at least one through-hole, each through-hole is communicated with a respective one of the at least one second groove. At least one second groove is disposed between two adjacent support strips.

In some embodiments, a material of the second elastic connection layer includes at least one of organic silica gel, thermoplastic elastomer or polyvinyl chloride.

In some embodiments, the support backplate further includes a first support sub-plate disposed at a side of the plurality of support strips in the first direction. The first elastic connection layer is further directly connected to the first support sub-plate.

In some embodiments, the support backplate further includes a second support sub-plate disposed at an opposite side of the plurality of support strips in the first direction. The first elastic connection layer is further directly connected to the second support sub-plate.

In some embodiments, the support strip has a first surface perpendicular to the thickness direction and facing away from the first elastic connection layer. The first support sub-plate has a second surface perpendicular to a thickness direction thereof and facing away from the first elastic connection layer. The second support sub-plate has a third surface perpendicular to a thickness direction thereof and facing away from the first elastic connection layer. The first surface, the second surface, and the third surface are in a same plane.

In some embodiments, the support backplate further includes a second elastic connection layer disposed on a side of the plurality of support strips facing away from the first elastic connection layer. The second elastic connection layer is directly connected to the support strip, and is further directly connected to the first support sub-plate and/or the second support sub-plate.

In some embodiments, the plurality of support strips include at least two support strip groups, each support strip group includes at least one support strip. The support backplate further includes a third support sub-plate disposed between any two adjacent support strip groups. The first elastic connection layer is further directly connected to the third support sub-plate.

In another aspect, a foldable display apparatus is provided. The foldable display apparatus includes a display panel having a bendable portion and the support backplate according to any one of the above embodiments. The support backplate is disposed on a side of the display panel opposite to a light exit side thereof, a bending direction of the display panel is parallel to the first direction. An orthogonal projection of the bendable portion on the first plane overlaps an orthogonal projection of the support strip on the first plane.

In some embodiments, the plurality of support strips are closer to the display panel than the first elastic connection layer. In the first direction, a first distance between surfaces facing away from the first elastic connection layer of two adjacent support strips of the plurality of support strips is less than or equal to a second distance between surfaces thereof facing the first elastic connection layer.

In yet another aspect, a method for manufacturing the support backplate according to any one of the above embodiments is provided. The method includes: providing a carrier film; arranging the plurality of support strips on the carrier film at intervals in the first direction; forming the first elastic connection layer on a side of the plurality of support strips facing away from the carrier film, the first elastic connection layer being directly connected to the support strip; and separating the carrier film from the plurality of support strips.

In some embodiments, forming the first elastic connection layer includes forming the first elastic connection layer extending into a gap between two adjacent support strips. The method further includes forming at least one first groove on a surface of the first elastic connection layer facing away from the plurality of support strips, at least one first groove being located between two adjacent support strips.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, and an actual process of a method to which the embodiments of the present disclosure relate.

FIG. 9B is a schematic diagram illustrating a structure of the foldable display apparatus in FIG. 8 after being bent outward;

FIG. 10 is a flow diagram of a method for manufacturing a support backplate in accordance with some embodiments;

DETAILED DESCRIPTION

Figure 1A:
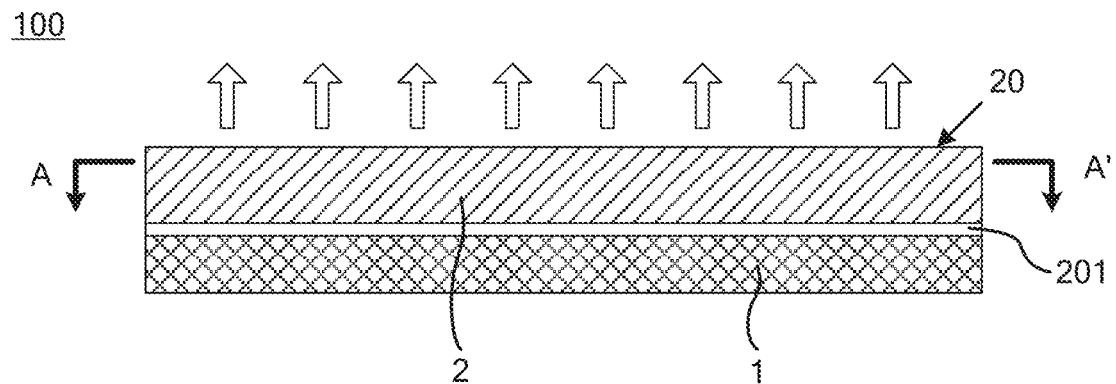
FIG. 1A is a schematic diagram illustrating a structure of a foldable display apparatus in accordance with some embodiments.

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to." In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, features defined as "first" and "second" may explicitly or implicitly include one or more of the features. As used in this description and the appended claims, the singular forms "a/an" and "the" may also include plural referents unless the content clearly dictates otherwise. In the description of the embodiments of the present disclosure, the term "a plurality of" means two or more unless otherwise specified.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The term "substantially", "approximately" or "about" as used herein includes a stated value and an average value within an acceptable range of deviation of a particular value determined by a person of ordinary skill in the art, considering measurement in question and errors associated with measurement of a particular quantity (i.e., limitations of a measurement system).

It will be understood that, when a layer or element is referred to as being on another layer or substrate, it may be directly on the another layer or substrate, or intervening layer(s) may also be present.

Exemplary embodiments are described herein with reference to sectional views and/or plan views as idealized exemplary drawings. In the accompanying drawings, thicknesses of layers and regions are enlarged for clarity. Exemplary embodiments of the present disclosure should not be construed to be limited to shapes of regions shown herein, but to include deviations in shape due to, for example, manufacturing. For example, an etched region that is shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a foldable display apparatus. As shown in FIG. 1, the foldable display apparatus 100 may serve as any product or component with a display function such as a television, a mobile phone, a tablet computer, a notebook computer, a digital photo frame or a navigator, and use of the foldable display apparatus 100 is not limited in the embodiments of the present disclosure.

In some embodiments, the foldable display apparatus 100 includes an electroluminescent display or a display of another type.

In some examples, the electroluminescent display includes an organic light-emitting diode (OLED) display, a quantum dot light-emitting diode (QLED) display, mini light-emitting diode (Mini-LED) display or a micro light-emitting diode (Micro-LED) display.

In some embodiments, as shown in FIG. 1A, the foldable display apparatus 100 includes a display panel 2 and a support backplate 1 disposed on a side of the display panel 2 opposite to a light exit side 20 thereof.

Since the foldable display apparatus 100 has a folding function, the display panel 2 herein is a flexible display panel which may be bent according to application requirements. The support backplate 1 provides support for the flexible display panel, that is to say, the support backplate 1 may be bent along with the bending of the flexible display panel.

In some examples, the display panel 2 and the support backplate 1 are fixed together by means of an adhesive, that is, as shown in FIG. 1A, an adhesive layer 201 is disposed between the display panel 2 and the support backplate 1.

Herein, a material of the adhesive layer 201 includes thermosetting resin or ultraviolet (UV) curable resin. For example, the material of the adhesive layer 201 is a pressure-sensitive adhesive (PSA), such as an acrylate pressure-sensitive adhesive.

Of course, the display panel 2 and the support backplate 1 may also be fixed together through other structures, such as fasteners. A manner in which the display panel 2 and the support backplate 1 are fixed is not limited in the embodiments of the present disclosure, as long as the fixation between them can be achieved.

Figure 1B:
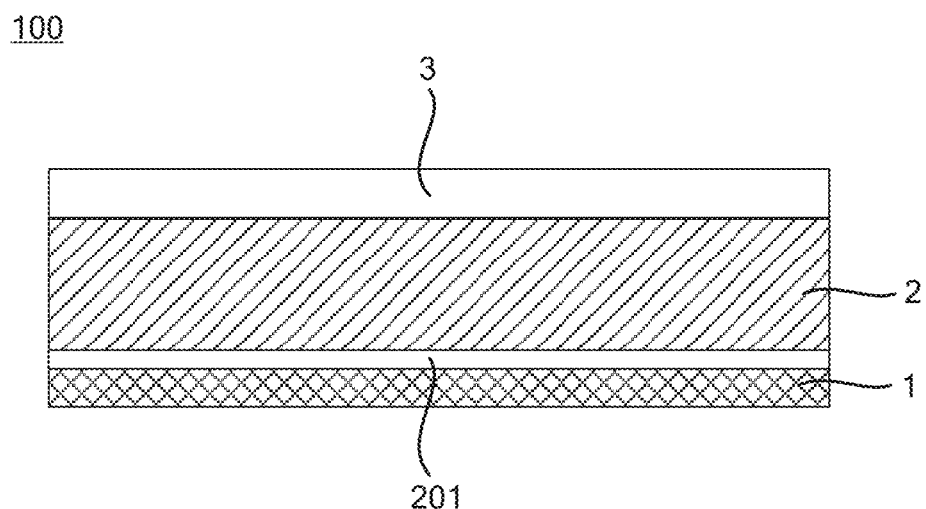
FIG. 1B is a schematic diagram illustrating a structure of another foldable display apparatus in accordance with some embodiments.

In some embodiments, as shown in FIG. 1B, the foldable display apparatus 100 may further include a cover plate 3 and other electronic accessories, such as a circuit board. Of course, the foldable display apparatus 100 in the embodiments of the present disclosure may further include more or fewer components, and relative positions of these components may be changed.

For example, the circuit board is configured to provide signals required for display to the display panel 2. For example, the circuit board is a printed circuit board assembly (PCBA) that includes a printed circuit board (PCB), a timing controller (TCON) disposed on the PCB, a power management integrated circuit (PMIC), and other ICs or circuits.

In addition, a structure of the display panel 2 is not limited in the embodiments of the present disclosure. For example, in a case where the foldable display apparatus 100 is an electroluminescent display, the display panel 2 is an electroluminescent display panel. In order to facilitate illustrating of the embodiments of the present disclosure, the structure of the display panel 2 will be exemplarily introduced below by taking an example in which the display panel 2 is the electroluminescent display panel. It will be understood that, the exemplary introduction below cannot be understood as limitations on the structure of the display panel 2 provided by the embodiments of the present disclosure, and the structure of the display panel 2 in the embodiments of the present disclosure may also have other variations.

Figure 3:
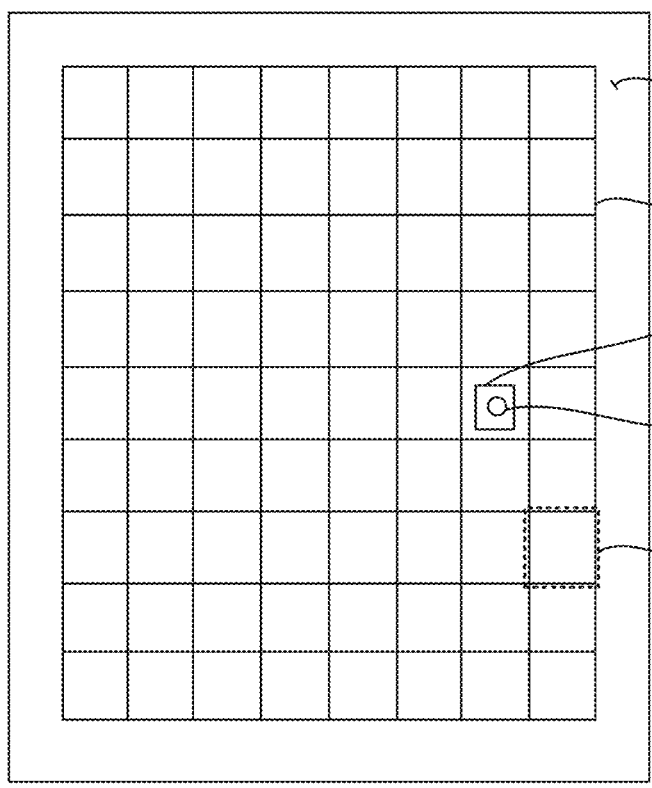
FIG. 3 is a schematic diagram illustrating a structure of a display panel in accordance with some embodiments.

In some embodiments, as shown in FIG. 3, the display panel 2 has a display area A and a peripheral area S located on at least one side of the display area A.

As shown in FIG. 3, the display panel 2 includes a plurality of sub-pixels P disposed in the display area A. FIG. 3 shows an example in which the plurality of sub-pixels P are arranged in a matrix with multiple rows and multiple columns. Herein, sub-pixels P arranged in the same line in an O1 direction (e.g., row direction) are referred to as sub-pixels in a row, and sub-pixels P arranged in the same line in an O2 direction (e.g., column direction) are referred to as sub-pixels in a column.

In some embodiments, the plurality of sub-pixels P include at least sub-pixels of a first color, sub-pixels of a second color, and sub-pixels of a third color. For example, the first color sub-pixels, the second color sub-pixels, and the third color sub-pixels are red sub-pixels, green sub-pixels, and blue sub-pixels, respectively. A distribution of the first color sub-pixels, the second color sub-pixels, and the third color sub-pixels may be, for example, that first color sub-pixels, second color sub-pixels, and third color sub-pixels in sub-pixels in each row are alternately arranged in sequence.

The peripheral area S is used for wiring, and of course, a driving circuit (e.g., a gate driver circuit) may also be disposed in the peripheral area S. In some examples, the peripheral area S is disposed around the display area A. In some other examples, the peripheral area S is located on only one side of the display area A. In yet some other examples, the peripheral area S is located on two opposite sides of the display area A. FIG. 3 shows an example in which the peripheral area S is disposed around the display area A.

Figure 2:
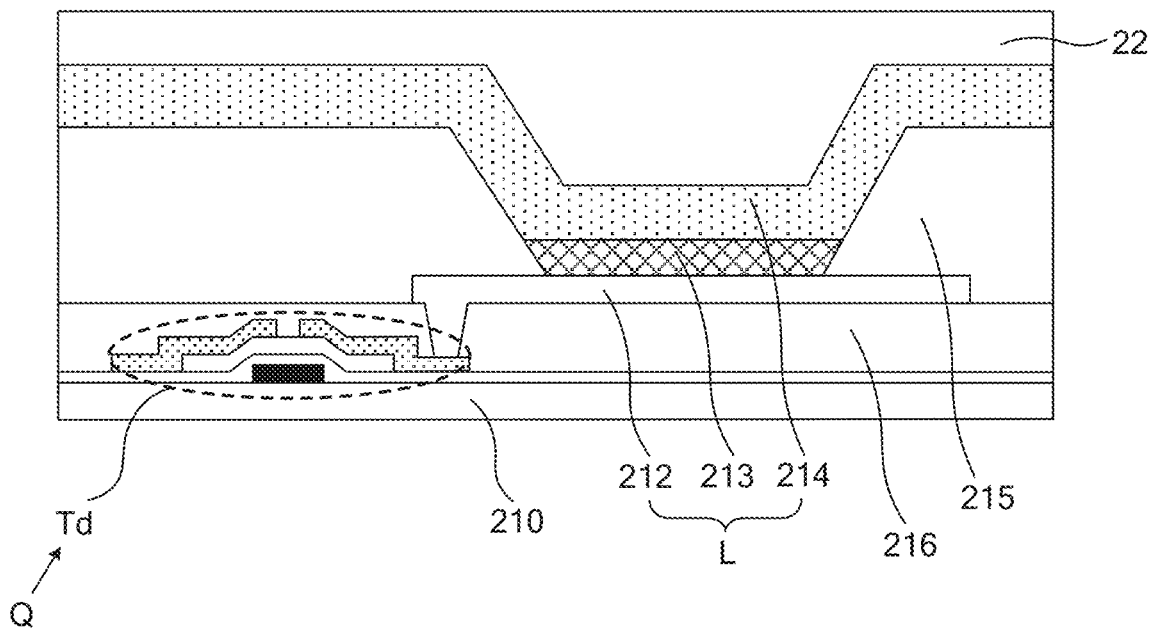
FIG. 2 is a sectional view of the foldable display apparatus in FIG. 1A taken along the line A-A'.

As shown in FIGS. 2 and 3, the display panel 2 further includes a base 210, and each sub-pixel P includes a light-emitting device L disposed on the base 210 and a pixel driving circuit Q electrically connected to the light-emitting device L.

In some embodiments, the base 210 is a flexible base, so that the bending of the display panel 2 may be achieved. For example, a material of the flexible base includes polyimide (PI). Of course, the material of the flexible base may include other materials, which are not limited in the embodiments of the present disclosure.

As shown in FIG. 2, the display panel 2 further includes a pixel defining layer 215. The pixel defining layer 215 includes a plurality of opening regions, and the light-emitting device L is disposed corresponding to one opening region.

In some embodiments, the light-emitting device L is an OLED, which includes a first electrode 212, a light-emitting functional layer 213, and a second electrode 214 that are stacked. For example, the first electrode 212 is an anode, and the second electrode 214 is a cathode. For another example, the first electrode 212 is a cathode, and the second electrode 214 is an anode.

In some examples, the display panel 2 is a top emission type display panel, and the first electrode 212 of the light-emitting device L is closer to the base 210 than the second electrode 214, in which case the first electrode 212 is opaque, and the second electrode 214 is transparent or translucent.

In some other examples, the display panel 2 is a bottom emission type display panel, and the first electrode 212 of the light-emitting device L is closer to the base 210 than the second electrode 214, in which case the first electrode 212 is transparent or translucent, and the second electrode 214 is opaque.

In yet some other examples, the display panel 2 is a double-sided emission type display panel, in which case the first electrode 212 and the second electrode 214 of the light-emitting device L are both transparent or translucent.

In some examples, the light-emitting functional layer 213 includes an emission layer (EML).

In some other examples, in addition to the emission layer, the light-emitting functional layer 213 further includes one or more of an electron injection layer (EIL), a hole block layer (HBL), an electron transporting layer (ETL), a hole transporting layer (HTL), an electron block layer (EBL) and a hole injection layer (HTL).

Figure 4:
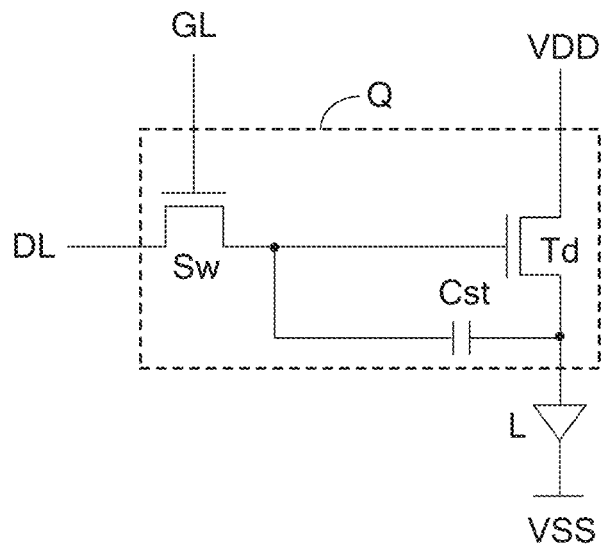
FIG. 4 is a schematic diagram illustrating a pixel driving circuit in accordance with some embodiments.

In some examples, as shown in FIG. 4, the pixel driving circuit Q includes a driving transistor Td, a switching transistor Sw and a storage capacitor Cst. That is, the pixel driving circuit Q is of a "2T1C" circuit structure. Herein, "T" indicates a transistor, and the number before "T" indicates the number of the transistors in the pixel driving circuit Q; and "C" indicates a capacitor, and the number before "C" indicates the number of the capacitor(s) in the pixel driving circuit Q.

As shown in FIG. 4, a gate electrode of the switching transistor Sw is electrically connected to a scanning signal line GL, a first electrode of the switching transistor Sw is electrically connected to a data signal line DL, and a second electrode of the switching transistor Sw is electrically connected to a gate electrode of the driving transistor Td. A first electrode of the driving transistor Td is electrically connected to a first power line VDD, and a second electrode of the driving transistor Td is electrically connected to the anode of the light-emitting device L. The cathode of the light-emitting device L is electrically connected to a second power line VSS. One terminal of the storage capacitor Cst is electrically connected to the gate of the driving transistor Td, and the other terminal of the storage capacitor Cst is electrically connected to the second electrode of the driving transistor Td. For example, the first power line VDD is configured to provide a high voltage signal, and the second power line VSS is configured to provide a low voltage signal.

The above is merely an example of the pixel driving circuit Q. The circuit structure of the pixel driving circuit 12 is not limited to the above structure, and may be a circuit structure of another type such as a "7T1C" circuit structure, which will not be listed herein. However, it will be understood that, regardless of which circuit structure the pixel driving circuit Q has, it includes at least a driving transistor, a switching transistor functioning as a switch, and a storage capacitor.

As shown in FIG. 2, the driving transistor Td includes an active layer, the first electrode (e.g., source electrode), the second electrode (e.g., drain electrode), the gate electrode and a part of a gate insulating layer, and the source and the drain are in contact with the active layer.

For example, a material of the active layer includes at least one of amorphous indium gallium zinc oxide (a-IGZO), zinc oxynitride (ZnON), indium zinc tin oxide (IZTO), amorphous silicon (a-Si), polycrystalline silicon (p-Si), sexithiophene and polythiophene.

As shown in FIG. 2, the display panel 2 further includes a planarization (PLN) layer 216 disposed between the pixel driving circuit Q and the light-emitting device L corresponding to the pixel driving circuit Q. The driving transistor Td is electrically connected to the first electrode 212 of the light-emitting device L through a via hole throughout the planarization layer 216. For example, the planarization layer 216 may be formed through an inkjet printing process after the pixel driving circuit Q is formed, and then the required via hole may be formed through a patterning process.

For example, a material of the planarization layer 216 includes, but is not limited to, a polysiloxane-based material, an acrylic-based material or a polyimide-based material.

As shown in FIG. 2, the display panel 2 further includes an encapsulation structure 22 to prevent moisture and oxygen from corroding the light-emitting device L. In some examples, the encapsulation structure 22 is an encapsulation film. The encapsulation film includes an organic encapsulation film and an inorganic encapsulation film. In some other examples, the encapsulation structure 22 is an encapsulation substrate.

On the basis of the above, some embodiments of the present disclosure provide a support backplate 1, which may be applied to the foldable display apparatus 100 described in the above embodiments. As shown in FIGS. 5 and 6A to 6K, the support backplate 1 includes a plurality of support strips 12 and a first elastic connection layer 11. The plurality of support strips 12 are arranged at intervals in a first direction X, and each support strip 12 extends in a second direction Y. The first direction X is perpendicular to a thickness direction T of the support strip 12, and the second direction Y is substantially perpendicular to the first direction X in a first plane perpendicular to the thickness direction T of the support strip 12. The first elastic connection layer 11 is disposed on a side of the plurality of support strips 12 in the thickness direction of the support strip 12, and is directly connected to the support strip 12.

In some embodiments, a material of the support strip 12 is a material with certain toughness and rigidity, such as metal, ultra-thin glass, ultra-thin ceramic or an organic material. The toughness of these materials ensures a recovery capability of the support backplate 1 after being bent and flatness of the support backplate 1 after being unfolded, while the rigidity of these materials ensures support performance of the support backplate 1.

In some examples, the material of the support strip 12 is metal, for example, stainless steel, copper (Cu) or the like. These materials have high rigidity and toughness, and may match various requirements of foldable displays.

In some embodiments, a material of the first elastic connection layer 11 is an elastic material, such as at least one of organic silica gel, a thermoplastic elastomer (TPE) or polyvinyl chloride (PVC).

In some examples, the material of the first elastic connection layer 11 is flexible PVC. In some other examples, the material of the first elastic connection layer 11 is the organic silica gel.

In an OLED foldable display apparatus, a support backplate is made of a rigid material, which results in large resilience, poor fatigue resistance, and easy fracture when the support backplate is bent, and is not favorable for folding of the display apparatus. Although by providing throughholes in the support backplate, a part of resilience may be released, the fatigue resistance of the support backplate is still poor since the support backplate is still a whole made of the rigid material.

In the support backplate 1 provided by the embodiments of the present disclosure, the plurality of support strips 12 are arranged at intervals, which are connected into a whole through the first elastic connection layer 11, so that support effect of the support backplate 1 on the display panel 2 is ensured. Moreover, when the support backplate 1 is bent, the plurality of support strips 12 and the first elastic connection layer 11 connected to the plurality of support strips 12 are also bent accordingly. Since the first elastic connection layer 11 has certain elasticity, the first elastic connection layer 11 may effectively release bending stress of the support backplate 1, thereby effectively reducing a deformation degree of the support strips 12 when the support backplate 1 is bent. As a result, the resilience of the support strips 12 reduces and the fatigue resistance of the support backplate 1 is improved, which facilitates the bending of the support backplate 1.

Figure 5:
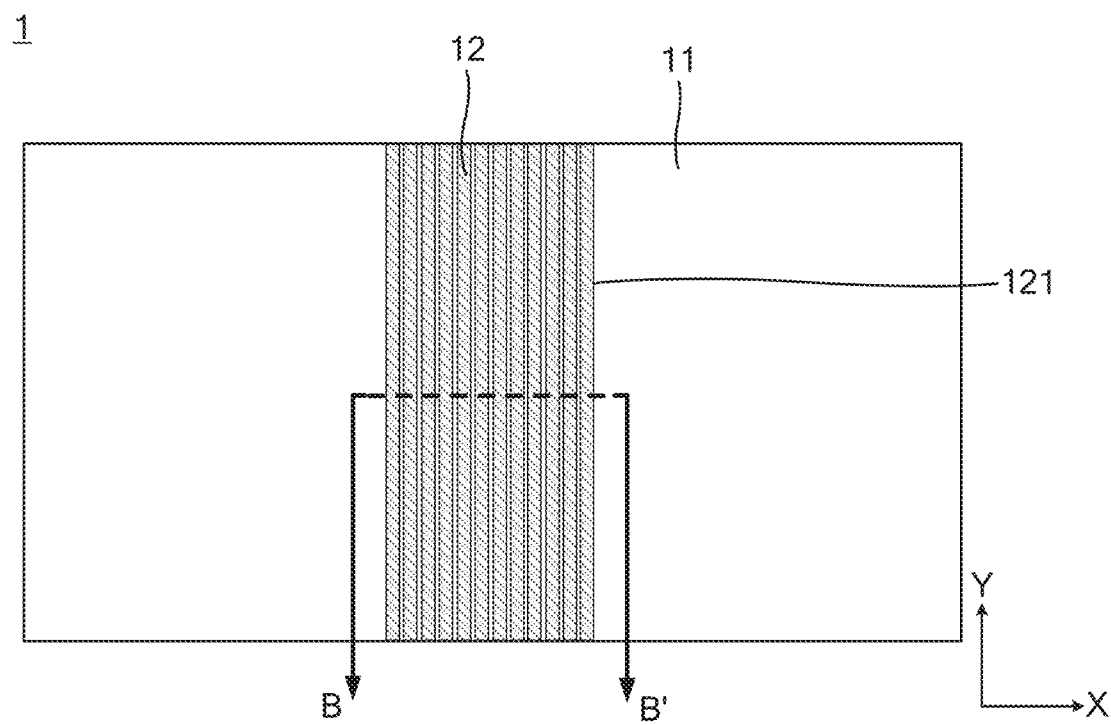
FIG. 5 is a schematic top view of a support backplate in accordance with some embodiments.

For example, as shown in FIG. 5, an included angle between the second direction Y and the first direction X is 90°. For another example, the included angle between the second direction Y and the first direction X is 95°, 92°, 89° or 85°.

In some examples, a distance between any two adjacent support strips 12 in the plurality of support strips 12 is exactly the same. In some other examples, a distance between any two adjacent support strips 12 in at least a part of the plurality of support strips 12 is not exactly the same.

In the embodiments of the present disclosure, the description "being not exactly the same" means that when describing certain parameters of some objects, the parameter of each object in a part of the objects is the same, the parameter of each object in a part of the objects is not the same, or the parameters of all the objects are different from each other. For example, a distance between any two adjacent support strips 12 in a part of the plurality of support strips 12 is the same, and a distance between any two adjacent support strips 12 in the other part of the plurality of support strips 12 is not the same; or a distance between any two adjacent support strips 12 in all the plurality of support strips 12 is not the same.

FIGS. 5 and 6A to 6K show an example in which a distance between any two adjacent support strips 12 in the plurality of support strips 12 is exactly the same. The embodiments of the present disclosure do not limit this, and a distance between any two adjacent support strips 12 may be selectively set according to actual requirements of the support backplate 1. For example, a distance between any two adjacent support strips 12 in a part of the plurality of support strips 12 at positions where a bending degree of the support backboard 1 is great may be made large, so that a portion of the first elastic connection layer 11 corresponding to this part of support strips 12 may release the bending stress to a greater degree.

In some examples, as shown in FIG. 5, lengths of the plurality of support strips 12 extending in the second direction Y are exactly the same. In some other examples, the lengths of the plurality of support strips 12 extending in the second direction Y are not exactly the same.

The embodiments of the present disclosure do not limit this, and the lengths of the plurality of support strips 12 extending in the second direction Y may be selectively set according to a shape of the display panel 2 and folding requirements of the display panel 2. For example, if the display area of the display panel 2 is in a rectangular shape, and a bending direction of the display panel 2 is parallel to the first direction X, the lengths of the plurality of support strips 12 extending in the second direction Y may be exactly the same. For another example, if the display area of the display panel 2 is in a circular shape or an elliptical shape, and the bending direction of the display panel 2 is parallel to the first direction X, the lengths of the plurality of support strips 12 extending in the second direction Y are not exactly the same. In this case, the lengths of the plurality of support strips 12 decreases from the center to two opposite sides, so as to match the circular or elliptical display area.

The embodiments of the present disclosure do not limit widths of the plurality of support strips 12 in the first direction X either. As shown in FIGS. 6A to 6E, the widths of the plurality of support strips 12 in the first direction X are exactly the same. Of course, the widths of the plurality of support strips 12 in the first direction X may not be exactly the same, and may be selectively set according to requirements.

The embodiments of the present disclosure do not limit the number of the support strips 12, which may be set according to bending requirements of the support backplate 1. For example, the support backplate has a bendable region with a large area. In this case, the support backplate may have a large number of support strips 12. For another example, the support backplate has a bendable region with a small area, in this case, the support backplate may have a small number of support strips to simplify a structure of the support backplate 1.

In some embodiments, in the first direction X, a first distance between surfaces facing away from the first elastic connection layer 11 of two adjacent support strips 12 of the plurality of support strips 12 is less than or equal to a second distance between surfaces thereof facing the first elastic connection layer 11.

In some examples, as shown in FIGS. 6A to 6D, in the first direction X, a first distance D1 between surfaces facing away from the first elastic connection layer 11 of any two adjacent support strips 12 of the plurality of support strips 12 is less than a second distance D2 between surfaces thereof facing the first elastic connection layer 11. That is to say, a gap between surfaces of any two adjacent support strips 12 facing the first elastic connection layer 11 is large, which makes a volume of a portion of the first elastic connection layer 11 between any two adjacent support strips 12 large.

In this way, when the support backplate 1 is bent inward, since portions of the two adjacent support strips 12 closer to the first elastic connection layer 11 are of a great stretching degree, it enables the portion of the first elastic connection layer 11 between the two adjacent support strips to release the bending stress to a greater degree by providing the second distance D2 being greater than the first distance D1. As a result, the deformation degree of the support strips 12 themselves is reduced, and the resilience of the support strips 12 is reduced, which is more conducive to the bending of the support backplate 1 and achieving a small bending radius. Herein, the description "being bent inward" means that an entire support backplate is bent toward a direction away from the first elastic connection layer (i.e., the fourth direction Z1 shown in FIG. 6B).

When the support backplate 1 is bent outward, since a squeezing degree of the portions of the two adjacent support strips 12 closer to the first elastic connection layer 11 is great, it enables the portion of the first elastic connection layer 11 between the two adjacent support strips to release the bending stress to a greater degree by providing the second distance D2 being greater than the first distance D1. As a result, the deformation degree of the support strips 12 themselves is reduced, and the resilience of the support strips 12 is reduced, which is more conducive to the bending of the support backplate 1 and achieving a small bending radius. Herein, the description "being bent outward" means that the entire support backplate is bent toward a direction close to the first elastic connection layer (i.e., the fifth direction Z2 shown in FIG. 6B).

Of course, it is also possible that, in the first direction X, a first distance D1 between surfaces facing away from the first elastic connection layer 11 of two adjacent support strips 12 in a part of the plurality of support strips 12 is less than a second distance D2 between surfaces thereof facing the first elastic connection layer 11, as long as the deformation degree of the support strips 12 themselves may be reduced, and the resilience thereof may be reduced, which is not limited in the embodiments of the present disclosure.

Figure 6A:
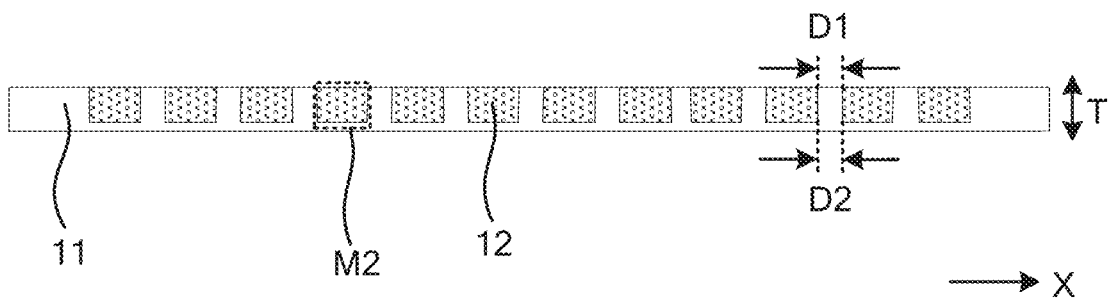
FIG. 6A is a schematic sectional view of the support backplate in FIG. 5 taken along the line B-B'.

In some examples, as shown in FIG. 6A, the first distance D1 is equal to the second distance D2, which may also enable the first elastic connection layer 11 to release the bending stress when the support backplate 1 is bent, thereby reducing the resilience of the support strips 12 and improving the fatigue resistance of the support backplate 1.

For example, as shown in FIG. 6A, a second section of the support strip 12 parallel to a second plane M2 is in a rectangular shape, and the second plane M2 is a plane parallel to the thickness direction T of the support strip 12 and parallel to the first direction X. For example, the thickness of the support strip 12 may be in a range of 0.1 mm to 0.5 mm, inclusive, such as 0.1 mm, 0.3 mm or 0.5 mm. Lengths of two edges perpendicular to the thickness direction T of the support strip 12 in the second section Y of the support strip 12 in the first direction X are the same, which are in a range of 0.05 mm to 0.25 mm, inclusive, such as 0.05 mm, 0.1 mm, 0.2 mm or 0.25 mm. The length of the support strip 12 extending in the second direction Y is in a range of 50 mm to 200 mm, inclusive, such as 50 mm, 70 mm, 100 mm, 120 mm, 150 mm, 180 mm or 200 mm.

Surfaces of two adjacent support strips 12 proximate to each other may be flat surfaces or curved surfaces, and shapes of the surfaces is not limited in the embodiments of the present disclosure, as long as it is satisfied that, in the first direction X, the first distance D1 between surfaces of the two adjacent support strips 12 facing away from the first elastic connection layer 11 is less than or equal to the second distance D2 between surfaces thereof facing the first elastic connection layer 11.

Figure 6B:
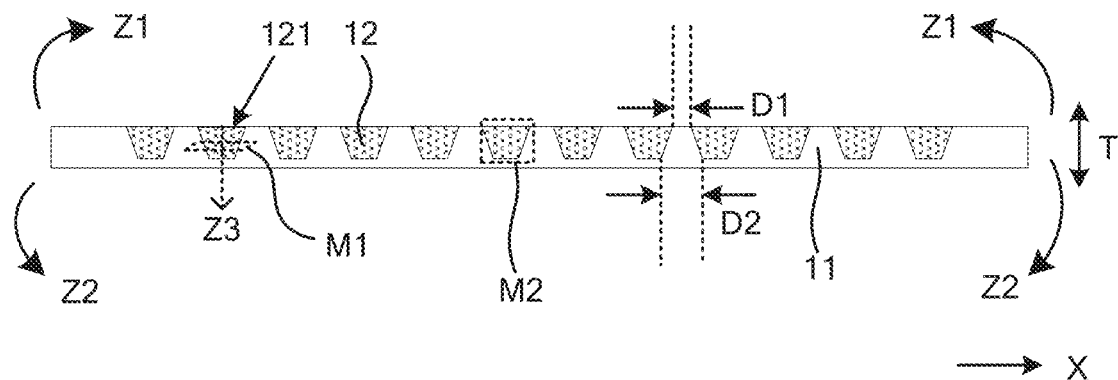
FIG. 6B is another schematic sectional view of the support backplate in FIG. 5 taken along the line B-B'.
Figure 6C:
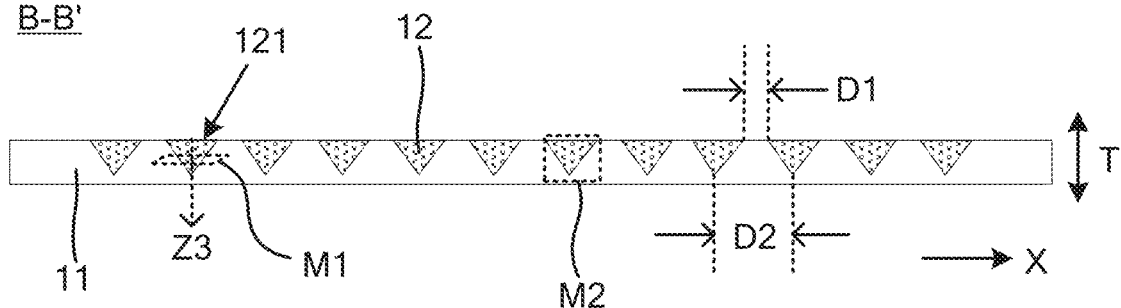
FIG. 6C is yet another schematic sectional view of the support backplate in FIG. 5 taken along the line B-B'.
Figure 6D:
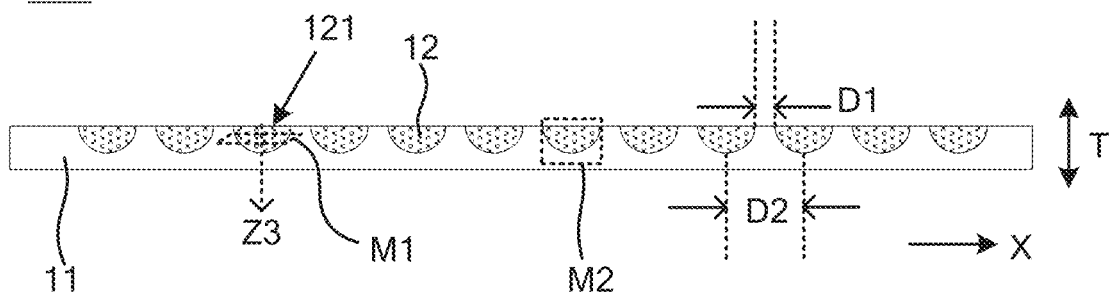
FIG. 6D is yet another schematic sectional view of the support backplate in FIG. 5 taken along the line B-B'.

In some examples, as shown in FIGS. 6B to 6D, the support strip 12 has a first surface 121 perpendicular to the thickness direction thereof and facing away from the first elastic connection layer 11. Areas of first sections of the support strip 12 parallel to the first plane M1 progressively decrease in a third direction Z3 pointing from the first surface 121 to the first elastic connection layer 11, and the third direction Z3 is parallel to the thickness direction T of the support strip 12.

In the embodiments of the present disclosure, as shown in FIGS. 6A to 6D, the first surface 121 of the support strip 12 is a flat surface. Of course, the first surface 121 of the support strip 12 may also be a curved surface, as long as it is ensured that support effect of the support strip 12 on the display panel 2 is achieved without affecting display of the display panel 2, and it is satisfied that, in the first direction X, the first distance D1 between surfaces of two adjacent support strips 12 facing away from the first elastic connection layer 11 is less than or equal to the second distance between surfaces thereof facing the first elastic connection layer 11. FIG. 5 only shows an example in which the first surface 121 of the support strip 12 is in a rectangular shape, and a width of the first surface 121 of each support strip 12 in the first direction X is the same. Of course, the widths of the first surfaces 121 of the plurality of support strips 12 in the first direction X may also not be exactly the same.

When the support backplate 1 is bent, regardless of whether it is bent inward or outward, acting force to which the support strip 12 is subjected progressively changes in the thickness direction T of the support strip 12. Therefore, the areas of the first sections of the support strip 12 progressively decrease in the third direction Z3 pointing from the first surface 121 to the first elastic connection layer 11, which is consistent with the direction in which the acting force to which the support strip 12 is subjected changes. This may reduce the deformation degree of the support strip 12 itself more effectively, reduce the resilience of the support strip 12 more effectively, and improve bending effect of the support backplate 1.

In some embodiments, as shown in FIG. 6B, the second section of the support strip 12 parallel to the second plane M2 is in a trapezoidal shape.

For example, the second section of the support strip 12 is in a shape of an isosceles trapezoid. A height of the isosceles trapezoid is in a range of 0.1 mm to 0.5 mm, inclusive. A length of an edge of the isosceles trapezoid closer to the first elastic connection layer 11 is in a range of 0.5 mm to 2 mm, inclusive, and a length of an edge farther away from the first elastic connection layer 11 is in a range of 1 mm to 2 mm, inclusive. The length of the support strip 12 extending in the second direction Y is in the range of 50 mm to 200 mm, inclusive.

In some other embodiments, as shown in FIG. 6C, the second section of the support strip 12 parallel to the second plane M2 is in a triangular shape.

For example, as shown in FIG. 6C, the second section of the support strip 12 is in a shape of an isosceles triangle. A height of the isosceles triangle is in a range of 0.1 mm to 0.5 mm, inclusive. The length of the support strip 12 extending in the second direction Y is in the range of 50 mm to 200 mm, inclusive.

In yet some other embodiments, as shown in FIG. 6D, the second section of the support strip 122 parallel to the second plane M2 is in a shape of a part of a circle, such as a semicircle. For example, the second section of the support strip 12 is in a shape of a semicircle, and a radius of the semicircle is in a range of 0.05 mm to 0.25 mm, inclusive. The length of the support strip 12 extending in the second direction Y is in the range of 50 mm to 200 mm, inclusive.

The embodiments of the present disclosure do not limit the shape of the second section of any support strip parallel to the second plane M2, and the shapes of the second sections of the plurality of support strips 12 parallel to the second plane M2 may not be exactly the same. For example, second sections of a part of the support strips 12 are in a rectangular shape, and second sections of the other part of the support strips 12 are in a trapezoidal shape. The shape of the second section of the support strip 12 parallel to the second plane M2 may be selectively set according to actual requirements, as long as it is suitable for production.

In some embodiments, as shown in FIGS. 6A to 6F, the first elastic connection layer 11 extends into a gap between two adjacent support strips 12, for example, the first elastic connection layer 11 extends into a gap between any two adjacent support strips 12. Thus, a contact area between the first elastic connection layer 11 and the plurality of support strips 12 is large, which may enhance firmness of the connection between the first elastic connection layer 11 and the plurality of support strips 12. Moreover, when the support backplate 1 is bent, a portion of the first elastic connection layer 11 between two adjacent support strips 12 may release bending stress of the two support strips 12, thereby reducing resilience of the two support strips 12. As a result, it facilitates to achieve a small bending radius of the support backplate 1, and improves the fatigue resistance of the support backplate 1.

In addition, compared to that after a display panel is attached to a support backplate with through-holes, the display panel sags at the through-holes, which will affects display effect, in the support backplate 1 provided by the embodiments of the present disclosure, as shown in FIGS. 6A to 6F, the first elastic connection layer 11 completely fills a gap between any two adjacent support strips 12, so that a good support effect of the first elastic connection layer 11 on the display panel 2 may be achieved at the gap between the two adjacent support strips 12, thereby preventing the display panel 2 from sagging at the gap between the two adjacent support strips 12, and further improving display effect of the display panel 2.

In some embodiments, a surface of the first elastic connection layer 11 facing away from the plurality of support strips 12 includes at least one first groove, and at least one first groove is disposed between two adjacent support strips 12.

Figure 6E:
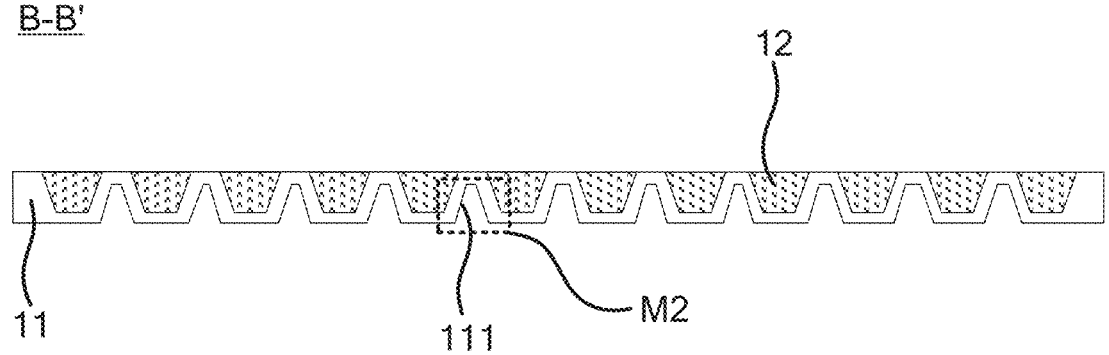
FIG. 6E is yet another schematic sectional view of the support backplate in FIG. 5 taken along the line B-B'.

In some examples, as shown in FIG. 6E, the at least one first groove 111 provided in the surface of the first elastic connection layer 11 facing away from the plurality of support strips 12 includes a plurality of first grooves 111, and any two adjacent support strips 12 are provided with a respective one of the plurality of first grooves 111 therebetween.

In a case where the first elastic connection layer 11 extends into a gap between two adjacent support strips 12, a first groove 111 between the two adjacent support strips 12 may also extend into the gap between the two adjacent support strips 12. In this way, when the support backplate 1 is bent, the first groove 111 may also release the bending stress, and may reduce the resilience of the support strips 12 effectively. In addition, a shape of a third section of the first groove 111 parallel to the second plane M2 may be adapted to a spatial shape of the gap between the two adjacent support strips 12.

For example, as shown in FIG. 6E, the shape of the third section of the first groove 111 parallel to the second plane M2 matches the gap between the two adjacent support strips 12. For example, in a case where the second section of the support strip 12 is in the trapezoidal shape, an orthogonal projection of the gap between the two adjacent support strips 12 on the second plane is in a shape of an inverted trapezoid complementary to the shape of the second section, and the third section of the first groove 111 parallel to the second plane M2 is also in a shape of an inverted trapezoid.

Of course, the first groove 111 may also not extend into the gap between the two adjacent support strips 12, and/or the third section of the first groove 111 parallel to the second plane M2 may also be in any other shape, and/or the shapes of the third sections of the plurality of first grooves 111 parallel to the second plane M2 may not be exactly the same, which are not limited in the embodiments of the present disclosure, as long as the first groove 111 may better release the stress when the support backplate 1 is bent.

In addition, the embodiments of the present disclosure do not limit the number of the first groove(s) 111, which may be selectively set according to the bending requirements of the support backplate 1. FIG. 5 only shows an example in which the first elastic connection layer 11 includes a plurality of first grooves 111, and any two adjacent support strips 12 are provided with one first groove 111 therebetween. In other examples, any two adjacent support strips 12 may be provided with two or more first grooves 111 therebetween, or any two adjacent support strips 12 in only a part of the plurality of support strips 12 may be provided with at least one first grooves 111 therebetween. Of course, the first elastic connection layer 11 may also include only one first groove 111 located between two adjacent support strips 12.

Figure 6F:
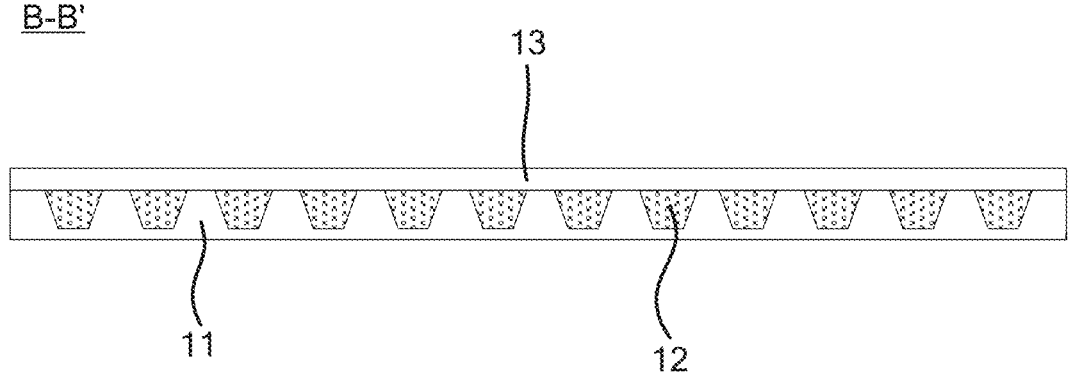
FIG. 6F is yet another schematic sectional view of the support backplate in FIG. 5 taken along the line B-B'.
Figure 6G:
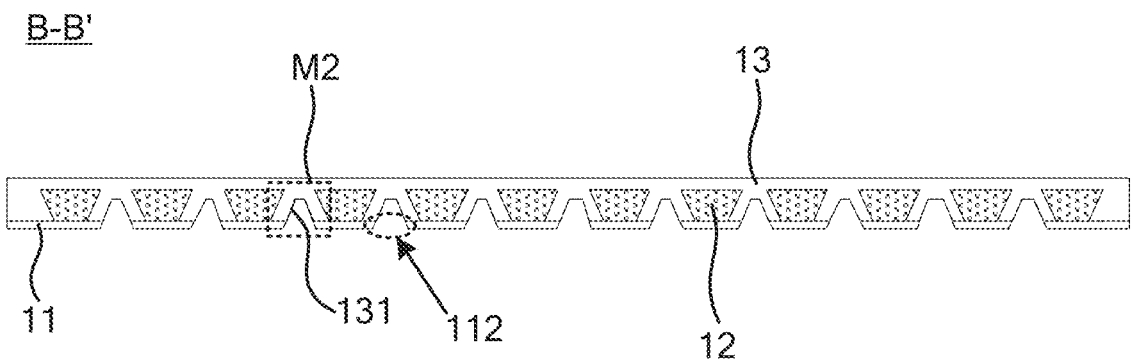
FIG. 6G is yet another schematic sectional view of the support backplate in FIG. 5 taken along the line B-B'.

In some embodiments, as shown in FIGS. 6F and 6G, the support backplate 1 further includes a second elastic connection layer 13 disposed on a side of the plurality of support strips 12 facing away from the first elastic connection layer 11, and the second elastic connection layer 13 is directly connected to the support strip 12. In this way, firmness of connection among the plurality of support strips 12 may be further enhanced.

A material of the second elastic connection layer 13 is an elastic material, such as at least one of organic silica gel, a thermoplastic elastomer or polyvinyl chloride. In this way, since the second elastic connection layer 13 also has certain elasticity, the second elastic connection layer 13 may also release certain bending stress when the support backplate 1 is bent, thereby further improving the fatigue resistance of the support backplate 1.

In some examples, the material of the second elastic connection layer 13 is the organic silica gel.

In some embodiments, the first elastic connection layer 11 and the second elastic connection layer 13 are made of the same material, for example, the organic silica gel. Thus, the first elastic connection layer 11 and the second elastic connection layer 13 at gaps between the plurality of support strips 12 have good cohesiveness, and the plurality of support strips 12 may be well wrapped, thereby achieving a good effect of releasing the bending stress when the support backplate 1 is bent.

Of course, the first elastic connection layer 11 and the second elastic connection layer 13 may also be made of different materials, as long as the first elastic connection layer 11 and the second elastic connection layer 13 may both release the bending stress when the support backplate 1 is bent, and it is ensured that the support backplate 1 does not fracture, which is not limited in the embodiments of the present disclosure.

In some examples, as shown in FIG. 6F, the second elastic connection layer 13 is only located on the side of the plurality of support strips facing away from the first elastic connection layer 11.

In some other examples, the second elastic connection layer 13 extends into a gap between two adjacent support strips 12. In this case, the first elastic connection layer 11 is only located on the side of the plurality of support strips 12 facing away from the second elastic connection layer 13. Of course, under a condition that a manufacturing method allows, both the first elastic connection layer 11 and the second elastic connection layer 13 may extend into the gap between the two adjacent support strips 12. In order to simplify the manufacturing method, the embodiments of the present disclosure are illustrated by taking an example in which only the first elastic connection layer 11 or the second elastic connection layer 13 extends into the gap between the two adjacent support strips.

In some other examples, as shown in FIG. 6G, the second elastic connection layer 13 extends into a gap between any two adjacent support strips 12, and a surface of the second elastic connection layer 13 facing the plurality of support strips 12 includes a plurality of second grooves 131, and each second groove 131 is disposed between two adjacent support strips 12. In this case, the first elastic connection layer 11 includes a plurality of through-holes 112, each through-hole 112 is communicated with a respective one of the plurality of second grooves 131, that is, the through-holes 112 and the second grooves 131 are of the same number.

Herein, a shape of a fourth section of the second groove 131 parallel to the second plane M2 may be adapted to a spatial shape of the gap between the two adjacent support strips 12. For example, as shown in FIG. 6G, the shape of the fourth section of each second groove 131 parallel to the second plane M2 matches the gap between the corresponding two adjacent support strips 12. For example, in the case where the second section of the support strip 12 is in the trapezoidal shape, an orthogonal projection of the gap between the two adjacent support strips 12 on the second plane M2 is in a shape of an inverted trapezoid complementary to the shape of the second section, and the fourth section of the second groove 131 parallel to the second plane M2 is also in a shape of an inverted trapezoid. Based on this, an orthogonal projection of the through-hole 112 communicated with the respective second groove 131 on the second plane M2 may also be in a shape of an inverted trapezoid matching the shape of the fourth section of the second groove 131.

Of course, the orthogonal projection of the through-hole 112 communicated with the respective second groove 131 on the second plane M2 may also be in other shapes, as long as it is ensured that the through-hole 112 is communicated with the respective second groove 131, which is not limited in the embodiments of the present disclosure.

In the embodiments of the present disclosure, in order to simplify the manufacturing method, the through-hole 112 and the second groove 131 communicated with each other may be formed through a single process. Therefore, the embodiments of the present disclosure are illustrated by taking an example in which the shape of the orthogonal projection of the through-hole 112 on the second plane M2 matches the shape of the fourth section of the corresponding second groove 131 parallel to the second plane M2.

In addition, the embodiments of the present disclosure do not limit the number of the second groove(s) 131, which may be selectively set according to the bending requirements of the support backplate 1. FIG. 6G only shows an example in which the second elastic connection layer 13 includes a plurality of second grooves 131, and any two adjacent support strips 12 are provided with one second groove 131 therebetween. In other examples, any two adjacent support strips 12 may be provided with two or more second grooves 131 therebetween, or any two adjacent support strips 12 in only a part of the plurality of support strips 12 may be provided with at least one second grooves 131 therebetween. Of course, the second elastic connection layer 13 may also include only one second groove 131 located between two adjacent support strips 12.

The embodiments of the present disclosure do not limit the number of the through-hole(s) 112 either, as long as the number of the through-hole(s) 112 is greater than or equal to the number of the second groove(s) 131. That is to say, one second groove 131 may correspond to at least one through-hole 112, which may ensure that the through-hole 112 and the second groove 131 communicated with each other release the bending stress when the support backplate is bent.

Figure 6H:
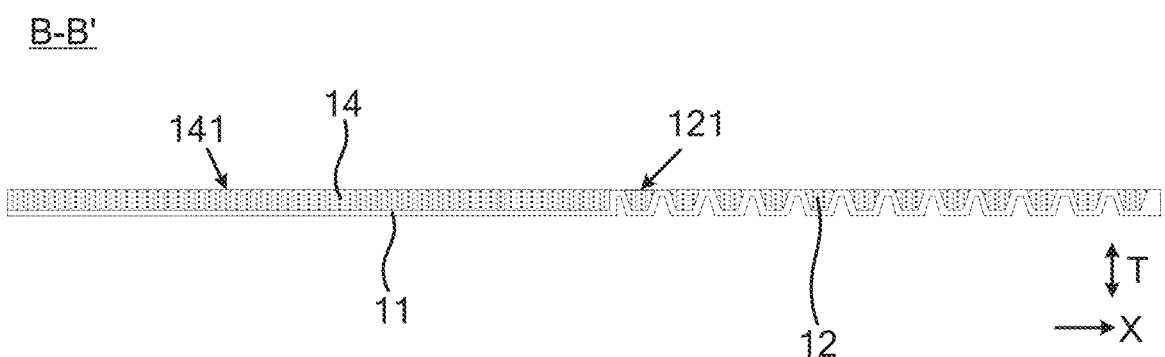
FIG. 6H is yet another schematic sectional view of the support backplate in FIG. 5 taken along the line B-B'.
Figure 6I:
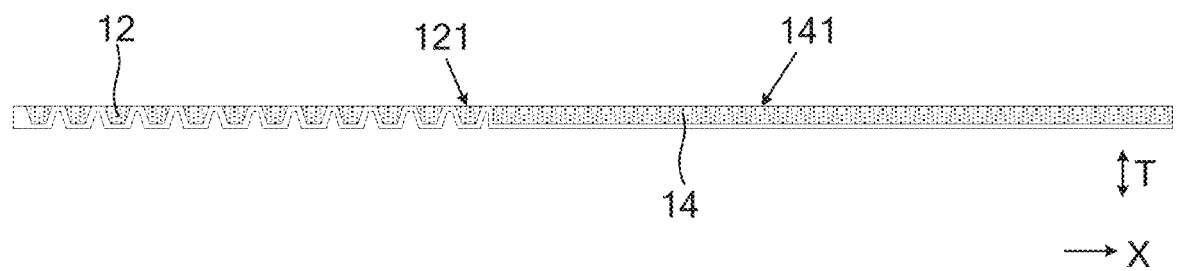
FIG. 6I is yet another schematic sectional view of the support backplate in FIG. 5 taken along the line B-B'.

In some embodiments, as shown in FIG. 6H or 6I, the support backplate 1 further includes a first support sub-plate 14 disposed at one side (e.g., the left side in FIG. 6H or the right side in FIG. 6I) of the plurality of support strips 12 in the first direction X, and there is a gap between the first support sub-plate 14 and the plurality of support strips 12. The first elastic connection layer 11 is further directly connected to the first support sub-plate 14. The first support sub-plate 14 provides further support for the display panel 2, and may improve effect of unfolding the support backplate 1 after being bent. In addition, the first support sub-plate 14 is located at the side of the plurality of support strips 12 in the first direction X, so that the support backplate 1 may be curled at positions where the plurality of support strips 12 are located.

In some examples, as shown in FIG. 6H or 6I, the first surfaces 121, facing away from the first elastic connection layer 11, of the plurality of support strips 12 are in the same plane. The first support sub-plate 14 has a second surface 141 perpendicular to a thickness direction thereof and facing away from the first elastic connection layer 11, and the thickness direction of the first support sub-plate 14 is parallel to the thickness direction T of the support strip 12. The first surfaces 121 of the plurality of support strips 12 are in the same plane as the second surface 141 of the first support sub-plate 14, so that a surface of the support backplate 1 perpendicular to its thickness direction is a flat surface, and the display panel 2 may be good supported without affecting the display effect of the display panel 2.

In some other examples, in a case where the support backplate 1 further includes the second elastic connection layer 13 (not shown in FIGS. 6H and 6I), the second elastic connection layer 13 is disposed on the side of the plurality of support strips 12 facing away from the first elastic connection layer 11, and the second elastic connection layer 13 is directly connected to the support strip 12 and the first support sub-plate 14, thereby further increasing firmness of connection between the plurality of support strips 12 and the first support sub-plate 14.

Figure 6J:
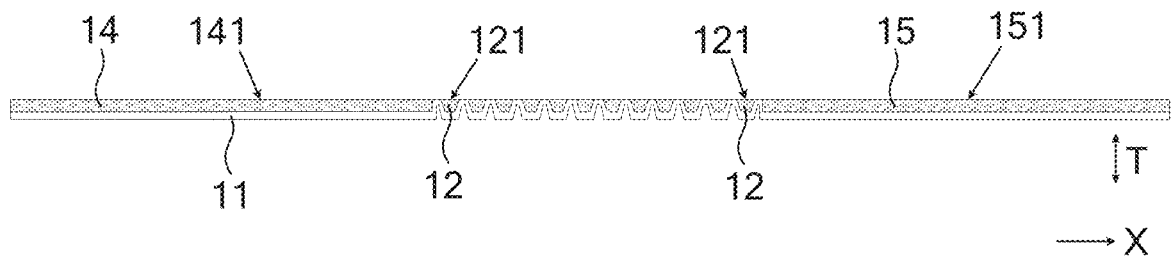
FIG. 6J is yet another schematic sectional view of the support backplate in FIG. 5 taken along the line B-B'.

In some embodiments, as shown in FIG. 6J, the support backplate 1 further includes a second support sub-plate 15 opposite to the first support sub-plate 14. That is, the second support sub-plate 15 is disposed at an opposite side of the plurality of support strips 12 in the first direction X. There is a gap between the second support sub-plate 15 and the plurality of support strips 12, and the first elastic connection layer ills further directly connected to the second support sub-plate 15. The second support sub-plate 15 provides further support for the display panel 2, and may further improve the effect of unfolding the support backplate 1 after being bent. In addition, the second support sub-plate 15 is located at the other side of the plurality of support strips 12 in the first direction X, so that the support backplate 1 may be curled at the positions where the plurality of support strips 12 are located.

In some examples, as shown in FIG. 6J, the first surfaces 121, facing away from the first elastic connection layer 11, of the plurality of support strips 12 are in the same plane. The second support sub-plate 15 has a third surface 151 perpendicular to a thickness direction thereof and facing away from the first elastic connection layer 11. The thickness direction of the second support sub-plate 15 is parallel to the thickness direction T of the support strip 12. The first surfaces 121 of the plurality of support strips are in the same plane as the third surface 151 of the second support sub-plate 15, so that the surface of the support backplate 1 perpendicular to its thickness direction is a flat surface, and the display panel 2 may be better supported without affecting the display effect of the display panel 2.

For example, the first support sub-plate 14 is disposed at a side (e.g., the left side in FIG. 6J) of the plurality of support strips 12 in the first direction X, and the second support sub-plate 15 is disposed at the other side (e.g., the right side in FIG. 6J) of the plurality of support strips 12 in the first direction X.

In some examples, as shown in FIG. 6J, the first surfaces 121 of the plurality of support strips 12, the second surface 141 of the first support sub-plate 14 and the third surface 151 of the second support sub-plate 15 are in the same plane, so that the surface of the support backplate 1 perpendicular to its thickness direction is a flat surface, and the display panel 2 may be better supported without affecting the display effect of the display panel 2.

In some other examples, in the case where the support backplate 1 further includes the second elastic connection layer 13 (not shown in FIG. 6J), the second elastic connection layer 13 is directly connected to the support strip 12, the first support sub-plate 14 and the second support sub-plate 15. In this way, the support backplate 1 may be bent at the positions where the plurality of support strips 12 are located, and regardless of whether it is bent inward or outward, the first elastic connection layer 11 and the second elastic connection layer 13 may both release the bending stress to reduce the resilience of the support strip 12, thereby improving the fatigue resistance of the support backplate 1.

In some embodiments, the thickness of the support strip 12 is equal to both the thickness of the first support sub-plate 14 and the thickness of the second support sub-plate 15.

Of course, the thickness of the support strip 12, the thickness of the first support sub-plate 14 and the thickness of the second support sub-plate 15 may also not be exactly the same. In this case, the support backplate 1 includes both the first elastic connection layer 11 and the second elastic connection layer 13. The first elastic connection layer 11 and the second elastic connection layer 13 wrap the plurality of support strips 12, the first support sub-plate 14 and the second support sub-plate 15 on both sides in the thickness direction T of the support backplate 1, so that surfaces of the support backplate 1 perpendicular to its thickness direction are both flat surfaces, the display panel 2 may be better supported, and it is possible to avoid a problem that the display panel 2 sags at the gaps between the plurality of support strips 12, the gap between the plurality of support strips and the first support sub-plate, and the gap between the plurality of support strips and the second support sub-plate.

In some embodiments, the plurality of support strips 12 includes at least two support strip groups 120, and each support strip group 120 includes at least one support strip 12.

The following embodiments of the present disclosure will be described by taking an example in which the at least two support strip groups 120 include three support strip groups 120, and each support strip group 120 includes six support strips. Of course, the support strip group 120 may also include other numbers of support strips 12, which are not limited in the embodiments of the present disclosure. The number of support strips 12 in the support strip group 120 may be set according to the bending requirements of the support backplate.

Figure 6K:
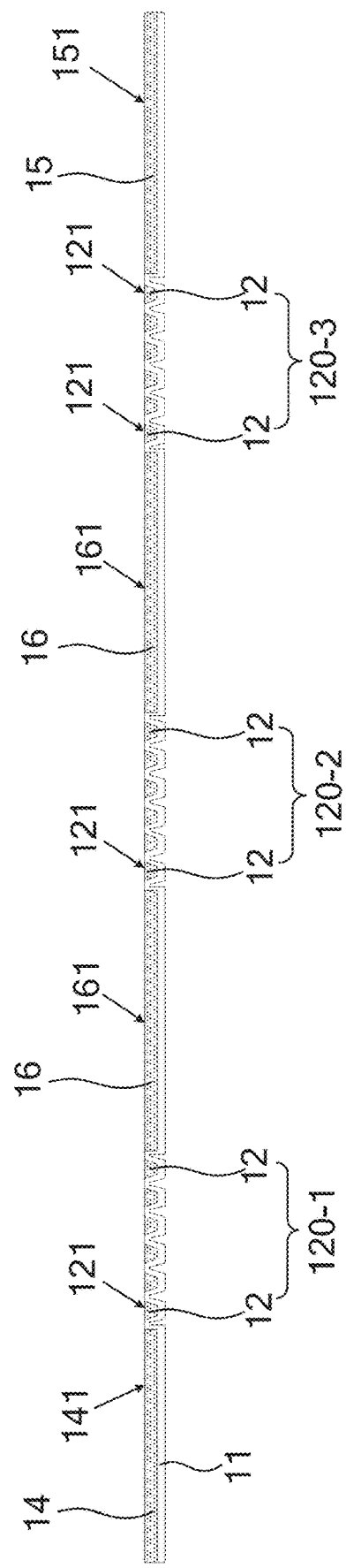
FIG. 6K is yet another schematic sectional view of the support backplate in FIG. 5 taken along the line B-B'.

As shown in FIG. 6K, the support backplate 1 includes the first support sub-plate 14 disposed at one side (e.g., the left side in FIG. 6K) of the three support strip groups 120 (i.e., 120-1, 120-2, and 120-3) in the first direction X, and the second support sub-plate 14 disposed at the other side (e.g., the right side in FIG. 6K) of the three support strip groups 120 (120-1, 120-2, and 120-3) in the first direction X.

Based on this, the support backplate 1 further includes a third support sub-plate 16 disposed between any two adjacent support strip groups 120, such as a third support sub-plate 16 disposed between the support strip group 120-1 and the support strip group 120-2, and another third support sub-plate 16 disposed between the support strip group 120-2 and the support strip group 120-3. The first elastic connection layer 11 is further directly connected to the third support sub-plates 16. In this way, the support backplate 1 may be bent at a position where the support strip group 120 is located.

Figure 7A:
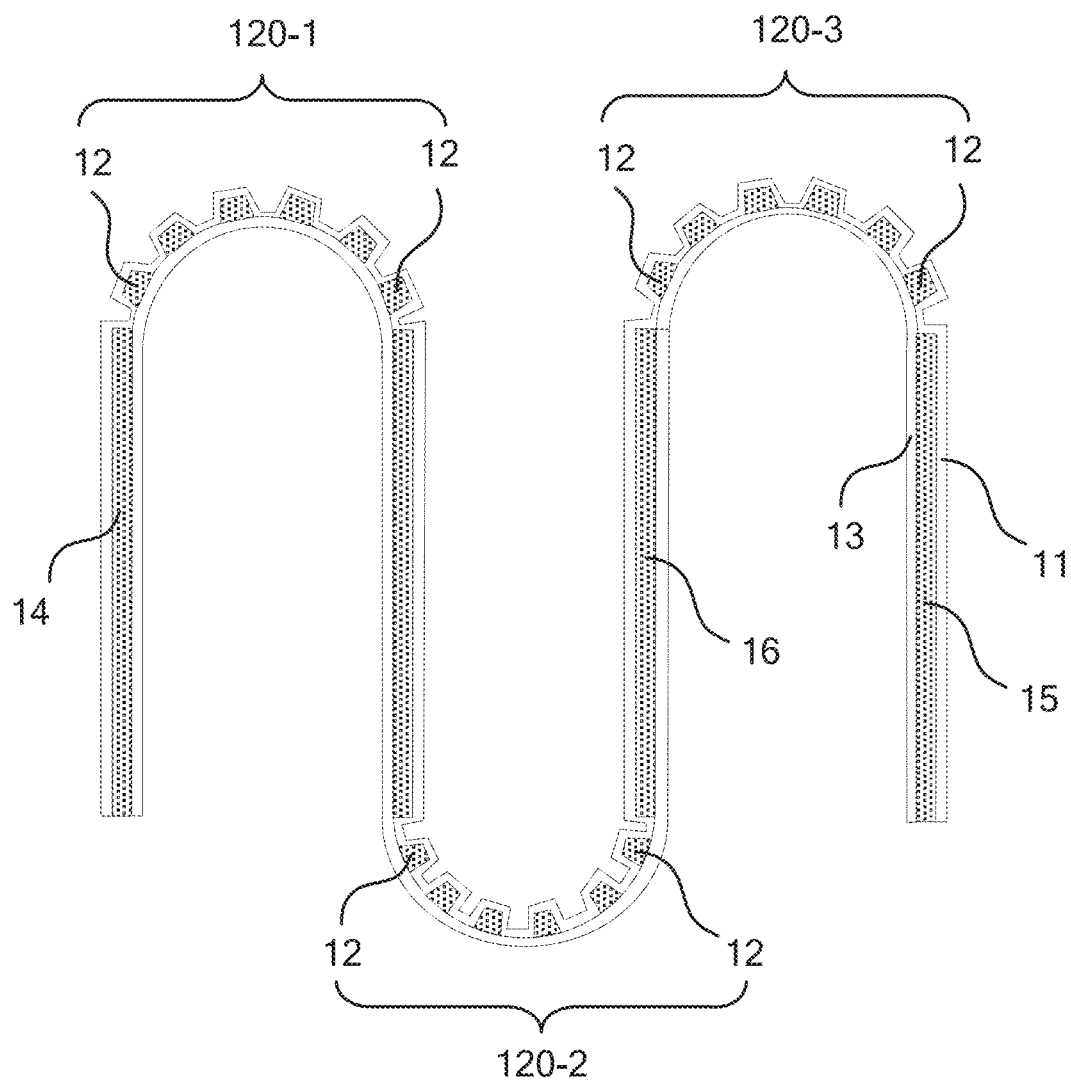
FIG. 7A is a schematic diagram illustrating a structure of the support backplate in FIG. 6K after being bent in a bending manner.

For example, as shown in FIG. 7A, the support backplate 1 is folded three times.

Figure 7B:
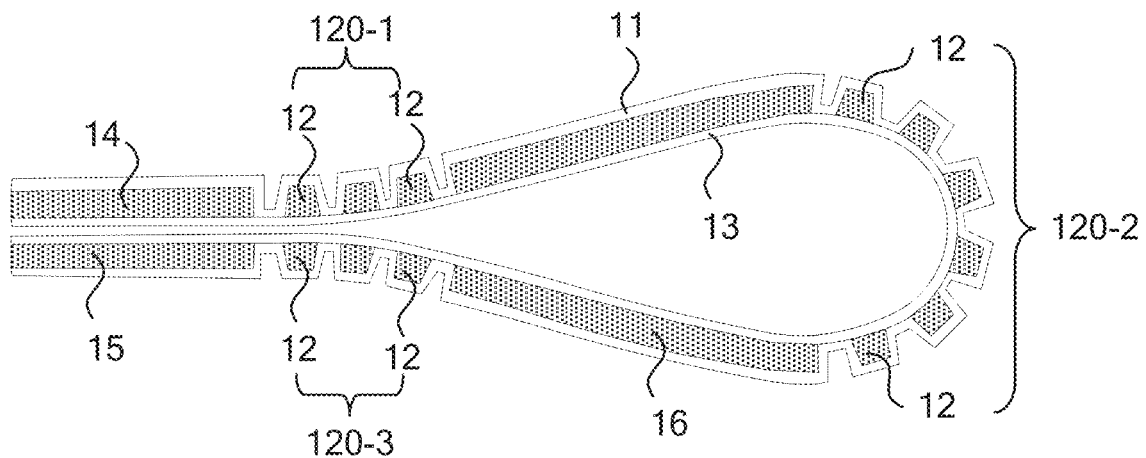
FIG. 7B is a schematic diagram illustrating a structure of the support backplate in FIG. 6K after being bent in another bending manner.

For another example, as shown in FIG. 7B, the support backplate 1 is folded once, and the folded support backplate 1 is in a shape of a water drop. The support backplate 1 has a greatest bending degree at a position where the support backplate 1 is completely folded (i.e., a position where the support strip group 120-2 is located), and has a small bending degree at remaining two positions (i.e., positions where the support strip groups 120-1 and 120-3 are located). In this case, the number of support strips 12 in the support strip group 120 (i.e., the support strip group 120-2 in FIG. 7B) at the position where the support backplate 1 has the greatest bending degree may be set large, so as to release the bending stress to a great degree and improve the fatigue resistance of the support backplane; and the number of support strips 12 in each of the support strip groups 120 (i.e., the support strip groups 120-1 and 120-3 in FIG. 7B) at the positions where the support backplate 1 has the small bending degree may be set small, so as to release the bending stress to a small degree and improve flatness of the support backplate 1 after being unfolded.

Based on this, as shown in FIGS. 7A and 7B, the support backplate 1 may further include the second elastic connection layer 13, which is connected to the support strip 12, the first support sub-plate 14, the second support sub-plate 15 and the third support sub-plates 16. The second elastic connection layer 13 may further reduce the resilience of the support strips 12 and resilience of the support sub-plates, thereby improving the fatigue resistance of the support backplate 1.

In some examples, as shown in FIG. 6K, the first surfaces 121 of the plurality of support strips 12, the second surface 141 of the first support sub-plate 14, the third surface 151 of the second 15, and fourth surfaces 161 of the third support sub-plates 16 are in the same plane, so that the surface of the support backplate 1 perpendicular to its thickness direction is a flat surface, and the support effect on the display panel 2 may be better achieved.

In some embodiments, thicknesses of the support strip 12, the first support sub-plate 14, the second support sub-plate 15 and the third support sub-plates 16 are the same.

Of course, the thicknesses of the support strip 12, the first support sub-plate 14, the second support sub-plate 15 and the third support sub-plates 16 may also not be exactly the same. In this case, the support backplate 1 includes both the first elastic connection layer 11 and the second elastic connection layer 13. The first elastic connection layer 11 and the second elastic connection layer 13 wrap the plurality of support strips 12, the first support sub-plate 14, the second support sub-plate 15 and the third support sub-plates 16 on both sides in the thickness direction T of the support backplate 1, so that the surfaces of the support backplate 1 perpendicular to its thickness direction are both flat surfaces, the display panel 2 may be better supported, and it is possible to avoid the problem that the display panel 2 sags at the gaps between the plurality of support strips 12 and a gap between the plurality of support strips and the support sub-plate.

Figure 8:
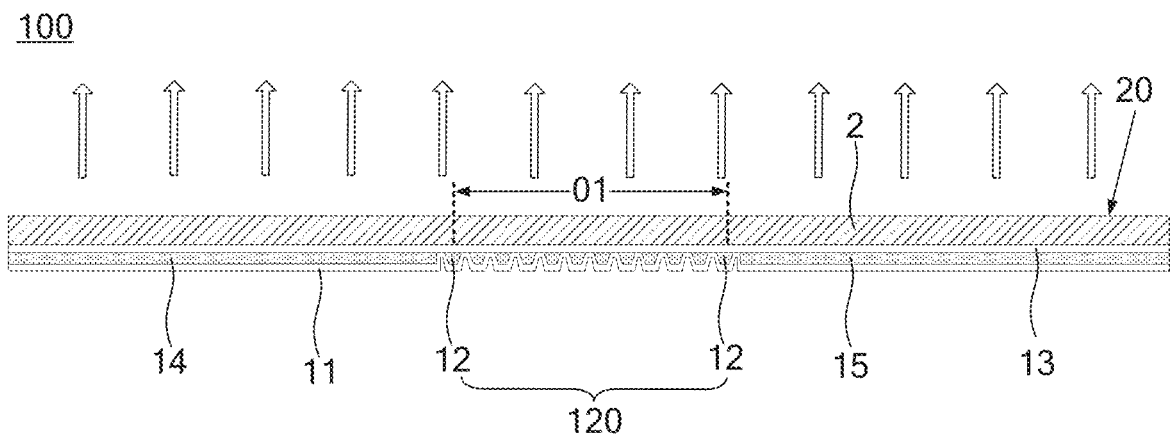
FIG. 8 is a schematic diagram illustrating a structure of yet another foldable display apparatus in accordance with some embodiments.

Base on this, the embodiments of the present disclosure provide the foldable display apparatus 100. As shown in FIG. 8, the foldable display apparatus 100 includes the display panel 2 and the support backplate 1 in any one of the above embodiments. The support backplate 1 is disposed on the side of the display panel 2 opposite to the light exit side 20 thereof.

As shown in FIG. 8, the display panel 2 has a bendable portion 01, and an orthogonal projection of the bendable portion 01 of the display panel 2 on the first plane overlaps an orthogonal projection of the support strip 12 in the support backplate 1 on the first plane. By bending the bendable portion 01 of the display panel 2, a folded state of the foldable display apparatus 100 may be achieved.

In the embodiments of the present disclosure, the bendable portion 01 may be a part of the display area or a non-display area of the display panel 2, which is not limited in the embodiments of the present disclosure, as long as it is a part of the display panel 2 that needs to be bent.

For example, the display panel 2 has one bendable portion 01. For another example, the display panel 2 has two or more bendable portions 01. The number of the bendable portion(s) 01 of the display panel 2 is not limited in the embodiments of the present disclosure, and may be set according to folding requirements of the foldable display apparatus 100. For example, in a case where the display panel 2 has two or more bendable portions 01, each bendable portion 01 may face a respective support strip group 120. For another example, some or all the bendable portions 01 may face the same support strip group 120. FIG. 8 shows an example in which the display panel 2 includes one bendable portion 01.

In the embodiments of the present disclosure, a bending direction of the display panel 2 (i.e., a folding direction of the foldable display apparatus 100) is parallel to the first direction X (i.e., an arrangement direction of the plurality of support strips 12 in the support backplate 1). In this way, the gaps between the plurality of support strips 12 and the first elastic connection layer 11 directly connected to the plurality of support strips 12 may release bending stress when the foldable display apparatus 100 is bent, thereby reducing the resilience of the support strips 12, improving the fatigue resistance of the backplate 1, and ensuring stability of folding performance of the foldable display apparatus 100.

Figure 9A:
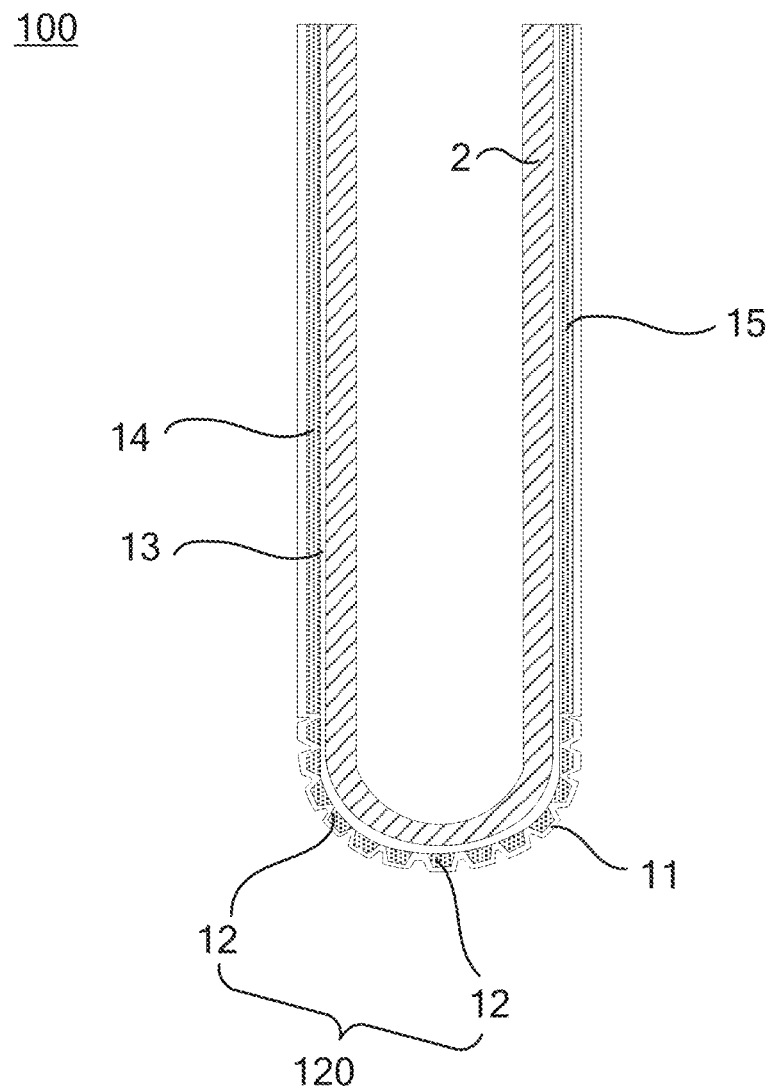
FIG. 9A is a schematic diagram illustrating a structure of the foldable display apparatus in FIG. 8 after being bent inward.

For example, as shown in FIG. 9A, an inward-bent state of the foldable display apparatus 100 may be achieved. That is, the foldable display apparatus is bent toward a direction of the display panel 2, and after the foldable display apparatus 100 is folded, the display panel 2 is wrapped inside, so that protective effect on the display panel 2 may be achieved. For another example, as shown in FIG. 9B, an outward-bent state of the foldable display apparatus 100 may be achieved. That is, the foldable display apparatus is bent toward a direction away from the display panel 2, and after the foldable display apparatus 100 is folded, the display panel 2 is exposed to an outside, so that normal display of the display panel 2 may be achieved in the folded state, and more requirements of users may be met.

In some embodiments, as shown in FIG. 8, in a case where in the first direction X, the first distance D1 between surfaces facing away from the first elastic connection layer 11 of two adjacent support strips 12 of the plurality of support strips 12 is less than or equal to the second distance D2 between surfaces thereof facing the first elastic connection layer 11, the plurality of support strips 12 are closer to the display panel 2 than the first elastic connection layer 11. Thus, as shown in FIGS. 9A and 9B, regardless of whether the foldable display apparatus is bent inward or outward, the first elastic connection layer 11 may effectively release the bending stress to reduce the deformation degree of the support strips 12 themselves, thereby reducing the resilience of the support strips 12, being more conducive to the bending of the support backplate 1, and achieving a good folding effect of the foldable display apparatus.

Some embodiments of the present disclosure provide a method for manufacturing the support backplate 1. As shown in FIG. 10, the method includes step 10 (S10) to step 40 (S40).

In S10, a carrier film 17 is provided.

Herein, in order to distinguish different carrier films, the carrier film 17 mentioned in S10 to S40 is referred to as a first carrier film 17 hereinafter.

In the embodiments of the present disclosure, the first carrier film 17 may be made of at least one of polyethylene terephthalate (PET), polyethylene naphthalate (PEN), polyimide (PI) or polytetrafluoroethylene (PTFE).

In some examples, the first carrier film 17 may be a PET protective film with a thickness of approximately 0.1 mm.

Figure 11A:
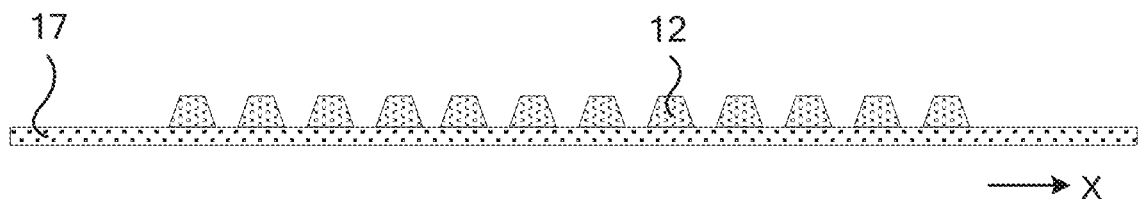
FIGS. 11A to 11E are schematic diagrams illustrating steps of a method for manufacturing a support backplate in accordance with some embodiments.

In S20, as shown in FIG. 11A, the plurality of support strips 12 are arranged on the first carrier film 17 at intervals in the first direction X.

Since the PET protective film itself has certain viscosity, the plurality of support strips 12 may be directly placed on the PET protective film at set intervals to fix the positions of the plurality of support strips 12.

Figure 11B:
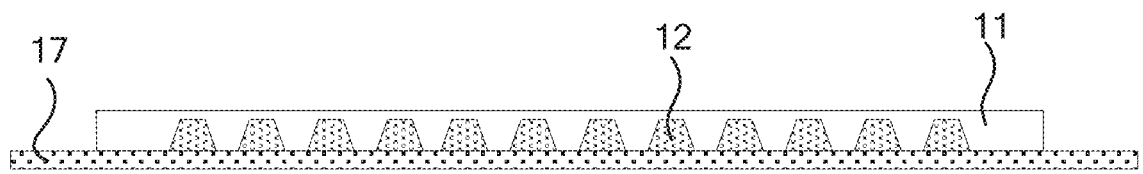

In S30, as shown in FIG. 11B, the first elastic connection layer 11 is formed on a side of the plurality of support strips 12 facing away from the first carrier film 17, and the first elastic connection layer 11 is directly connected to the support strip 12.

In some examples, the material of the first elastic connection layer 11 is the organic silica gel. In this case, S30 includes step 301 (S301) and step 302 (S302).

In S301, the side of the plurality of support strips 12 facing away from the first carrier film 17 is coated with the organic silica gel.

In S302, the organic silica gel is cured to form the first elastic connection layer 11. For example, curing conditions of the organic silica gel are that temperature is in a range of 80° C. to 120° C., and time is approximately 10 minutes. Of course, the curing conditions may be set according to actual situation. For example, the organic silica gel may also be cured at a normal temperature.

Of course, the material of the first elastic connection layer 11 may also be the TPE or the soft PVC, etc., and in this case, the first elastic connection layer 11 is formed in similar methods as those in S301 and S302.

In some examples, between S20 and S30, the method further includes step 21 (S21).

In S21, surfaces of the support strips 12 are cleaned, so that the plurality of support strips 12 and the first elastic connection layer 11 have good adhesion, and the firmness of the connection between the plurality of support strips 12 and the first elastic connection layer 11 is improved.

For example, the surfaces of the plurality of support strips 12 are cleaned by using a plasma technology.

In S40, the first carrier film 17 is separated from the plurality of support strips 12 to obtain the support backplate 1.

In the embodiments of the present disclosure, in a case where the first carrier film is the PET protective film, the PET protective film may be directly torn off from the surfaces of the plurality of support strips by using external force.

Of course, the first carrier film 17 in the embodiments of the present disclosure may also be made of other materials. Therefore, a method for separating the first carrier film 17 from the plurality of support strips 12 may be selectively used according to the material of the first carrier film 17. For example, the first carrier film 17 is a UV viscosity-reducing protective film. Since viscosity of the UV viscosity-reducing protective film is reduced when irradiated with the UV, the method for separating the first carrier film 17 from the plurality of support strips 12 may be an UV irradiation method.

In some embodiments, between S30 and S40, the method further includes step 31 (S31).

Figure 11C:
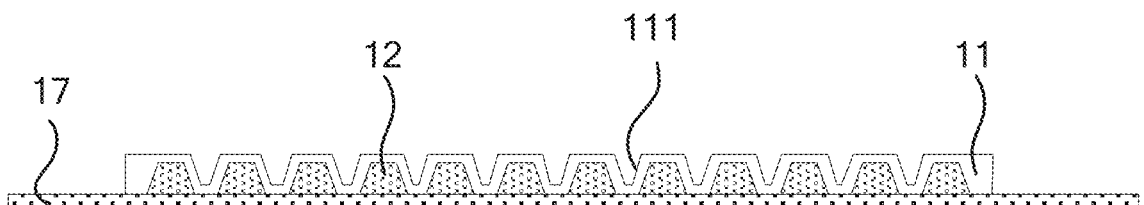

In S31, referring to FIG. 11C, the at least one first groove 111 is formed on the surface of the first elastic connection layer 11 facing away from the plurality of support strips 12, and at least one first groove 111 is located between two adjacent support strips 12.

For example, a gap between two adjacent support strips 12 is cut by using a cutter wheel to form a first groove 111. Cutting parameters of the cutter wheel may be set according to a design of the first groove 111, for example, a cutting width is less than a minimum distance between two adjacent support strips, and a cutting depth is less than a thickness of the first elastic connection layer 11.

For another example, a gap between two adjacent support strips 12 is cut by using a laser cutting method to form a first groove 111. The laser parameters may also refer to the above cutting parameters, which are not limited here.

Of course, the first groove may also be formed by using other methods, which are not limited in the embodiments of the present disclosure.

In some embodiments, after S40, the method further includes step 50 (S50) and step 60 (S60).

Figure 11D:
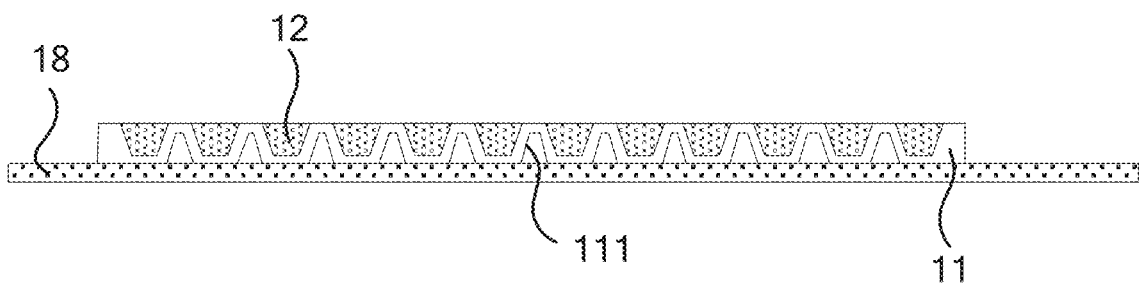

In S50, as shown in FIG. 11D, the plurality of support strips 12 connected through the first elastic connection layer 11 are placed on another carrier film (i.e., second carrier film 18) in reverse. That is, the side of the first elastic connection layer 11 facing away from the plurality of support strips 12 is placed on the second carrier film 18.

For example, the second carrier film 18 is a PET protective film. For another example, the second carrier film 18 is a UV viscosity-reducing protective film.

Herein, the materials of the first carrier film 17 and the second carrier film 18 may be the same or different, which is not limited in the embodiments of the present disclosure, as long as they can function to fix the positions of the plurality of support strips 12.

Figure 11E:
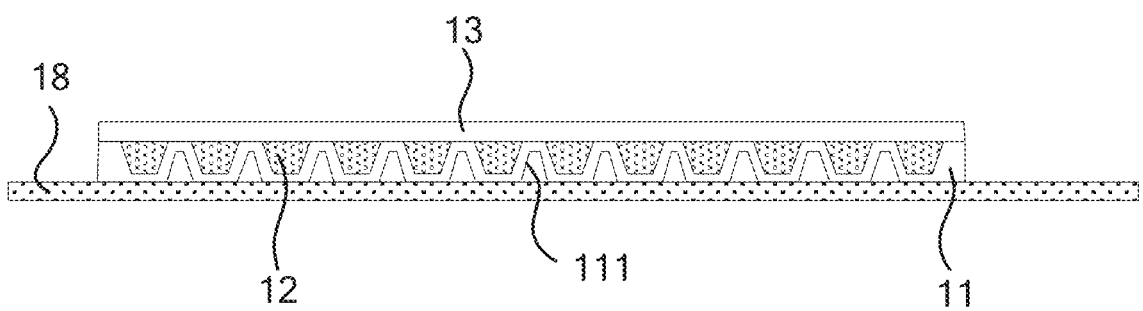

In S60, as shown in FIG. 11E, the second elastic connection layer 13 is formed on the side of the plurality of support strips 12 facing away from the first elastic connection layer 11, and the second elastic connection layer 13 is directly connected to the support strip 12.

In some examples, a material of the second elastic connection layer 13 is the organic silica gel. In this case, S60 includes step 601 (S601) and step 602 (S602).

In S601, the side of the plurality of support strips 12 facing away from the first elastic connection layer 11 is coated with an organic silica gel.

In S602, the organic silica gel is cured to form the second elastic connection layer 13.

Herein, S601 is similar to S301, and S602 is similar to S302, and details will not be repeated herein.

In some examples, between S50 and S60, the method further includes step 51 (S51).

S51 is similar to S21, and details will not be repeated herein.

In S70, the second carrier film 18 is separated from the plurality of support strips 12 to obtain the support backplate 1.

Herein, S70 is similar to S40, and details will not be repeated herein.

In some other embodiments, the support backplate 1 further includes at least one of the first support sub-plate 14, the second support sub-plate 15 or the third support sub-plate(s) 16.

Based on this, in S20 of the method, while the plurality of support strips 12 are arranged on the first carrier film 17 at intervals in the first direction X, the support sub-plates and the plurality of support strips 12 are arranged on the first carrier film 17 at intervals in the first direction X according to the structural design of the support backplate 1. Remaining subsequent steps are the same as those in the method, and details will not be repeated herein.

In yet some other embodiments, as shown in FIG. 6G, the support backplate 1 includes the first elastic connection layer 11 and the second elastic connection layer 13, the second elastic connection layer 13 extends into the gap between two adjacent support strips 12, and the surface of the second elastic connection layer 13 facing the plurality of support strips 12 includes the plurality of second grooves 131, and each second groove 131 is disposed between two adjacent support strips 12. The first elastic connection layer 11 includes the plurality of through-holes 112, the number of the through-holes 112 is equal to the number of the second grooves, and each through-hole 112 is connected with a respective second groove 131.

In this case, the method for manufacturing the support backplate 1 includes step 10' (S10') to step 80' (S80').

In S10', the first carrier film 17 is provided.

In S20', the plurality of support strips 12 are arranged on the first carrier film 17 at intervals in the first direction X.

Figure 12A:
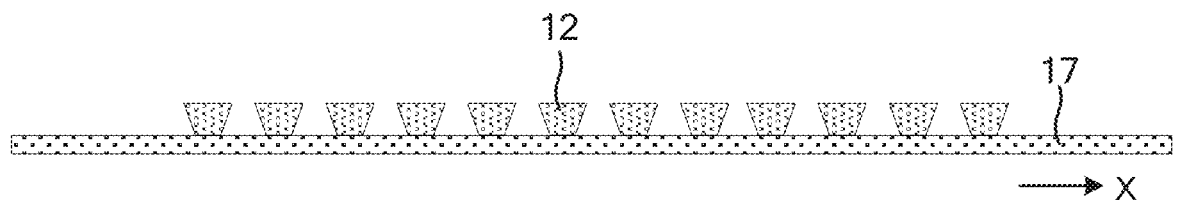
FIGS. 12A to 12E are schematic diagrams illustrating steps of another method for manufacturing a support backplate in accordance with some embodiments.

S10' is the same as S10 in the above method, and details will not be repeated herein. S20' is similar to S20 in the above method, except that, for example, in the case where the second section of the support strip 12 is in the trapezoidal shape, in S20, as shown in FIG. 11A, a surface with a large area in two surfaces of the support strip 12 perpendicular to its thickness direction is placed on the first carrier film 17; while in S20', as shown in FIG. 12A, a surface with a small area is placed on the first carrier film 17.

Figure 12B:
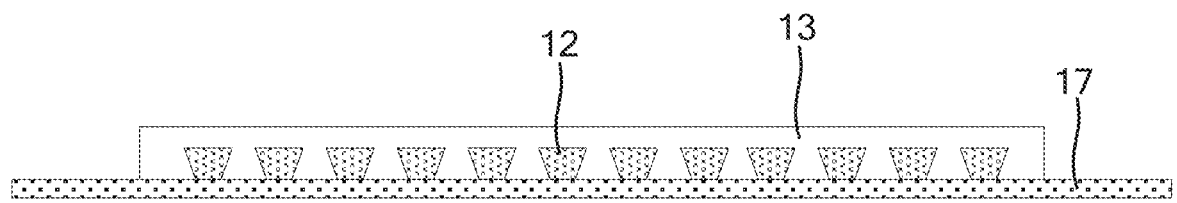

In S30', as shown in FIG. 12B, the second elastic connection layer 13 is formed on the side of the plurality of support strips 12 facing away from the first carrier film 17, and the second elastic connection layer 13 is directly connected to the support strip 12.

In some examples, the material of the second elastic connection layer 13 is an organic silica gel. In this case, S30' includes step 301' (S301') and step 302' (S302').

In S301', the side of the plurality of support strips 12 facing away from the first carrier film 17 is coated with the organic silica gel.

S302' is the same as S602, and details will not be repeated herein.

In some examples, between S20' and S30', the method further includes step 21' (S21').

Herein, S21' is the same as S21, and details will not be repeated herein.

In S40', the first carrier film 17 is separated from the plurality of support strips 12.

Herein, S40' is the same as S40.

Figure 12C:
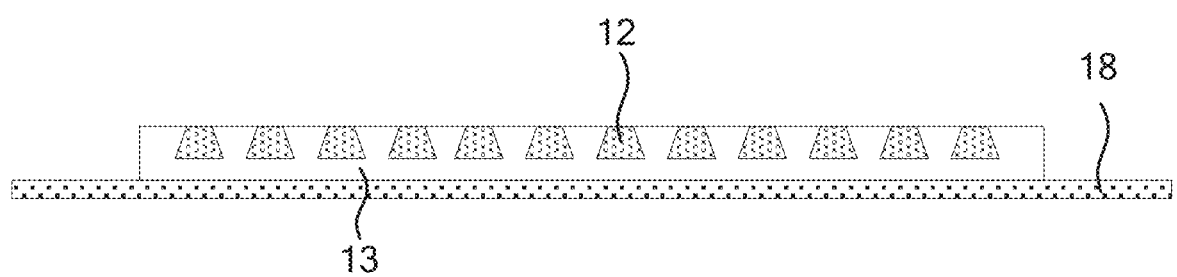

In S50', as shown in FIG. 12C, the plurality of support strips 12 connected to the second elastic connection layer 11 are placed on the second carrier film 18 in reverse. That is, a surface of the second elastic connection layer 13 facing away from the plurality of support strips 12 is placed on the second carrier film 18.

Figure 12D:
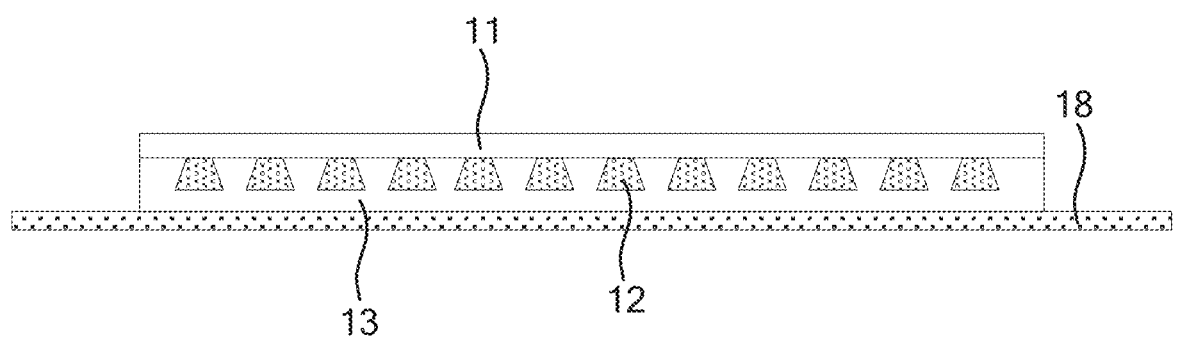

In S60', as shown in FIG. 12D, the first elastic connection layer 11 is formed on the side of the plurality of support strips 12 facing away from the second elastic connection layer 13, and the first elastic connection layer 11 is directly connected to the support strip 12.

Herein, S60' is similar to S30, and details will not be repeated herein.

Figure 12E:
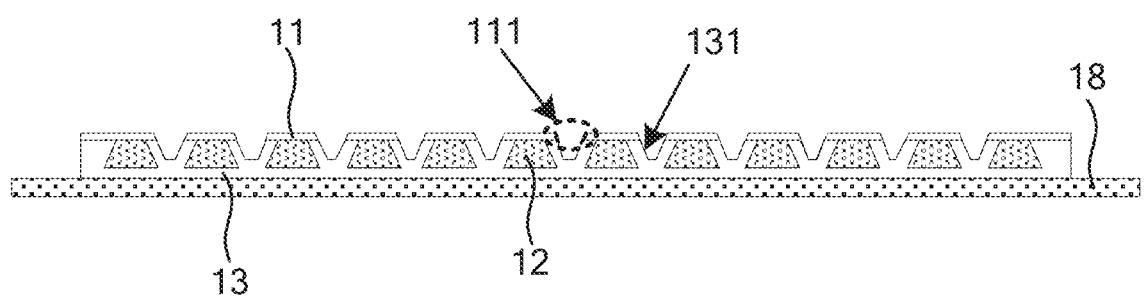

In S70', as shown in FIG. 12E, the through-holes 112 and the second grooves 131 that are communicated are simultaneously formed on the surface of the first elastic connection layer 11 facing away from the plurality of support strips 12 and the surface of the second elastic connection layer 13 facing the plurality of support strips 12, respectively.

For example, a gap between two adjacent support strips 12 is cut by using the cutter wheel, and the cutting parameters may be set according to actual situation. For example, the cutting depth is greater than the thickness of the first elastic connection layer 11, and is less than a sum of the thickness of the first elastic connection layer 11 and the thickness of the second elastic connection layer 13, and the cutting width is less than the minimum distance between two adjacent support strips.

In S80', the second carrier film 18 is separated from the plurality of support strips 12 to obtain the support backplate 1.

Herein, S80' is similar to S40, and details will not be repeated herein.

Some embodiments of the present disclosure provide a method for manufacturing the flexible display apparatus 100, and the method includes step 100 (S100).

In S100, the display panel 2 is attached to the support backplate 1.

For example, the display panel 2 is attached to the support backplate 1 by means of an adhesive. In this case, S100 includes step 110 (S110) and step 120 (S120).

In S110, the PSA is coated on a surface of the support backplate 1 facing the display panel 2, for example, a surface of the support backplate 1 facing away from the first elastic connection layer 11, so as to form the adhesive layer 201.

In S120, the display panel 2 is transferred to a side of the adhesive layer 201 facing away from the support backplate 1, and then a pressure is applied to make them tightly attached.

In some examples, in a case where the material of the first elastic connection layer 11 or the second elastic connection layer 13 in the support backplate 1 is the organic silica gel, before S110, the method further includes step 101 (S101).

In S101, a silica gel surface treatment agent is coated on the surface of the support backplate 1 facing the display panel 2, and then is dried, for example, at a normal temperature for 5 to 10 minutes. In this way, strength of adhesion between the adhesive layer 201 and the support backplate 1 may be improved.

The foregoing descriptions are merely specific implementations of the present disclosure, but the protection scope of the present disclosure is not limited thereto, and any changes or replacements that a person skilled in the art could conceive of within the technical scope of the present disclosure should be within the protection scope of the present disclosure. Therefore, the protection scope of the present disclosure shall be subject to the protection scope of the claims.

What is claimed is:

1. A support backplate, comprising:
   a plurality of support strips arranged at intervals in a first direction, each support strip of the plurality of support strips extending in a second direction, the first direction being perpendicular to a thickness direction of the support strip, and the second direction being substantially perpendicular to the first direction in a first plane perpendicular to the thickness direction;
   a first elastic connection layer disposed on a side of the plurality of support strips in the thickness direction, the first elastic connection layer being directly connected to each support strip; and
   a second elastic connection layer disposed on a side of the plurality of support strips facing away from the first elastic connection layer, the second elastic connection layer being directly connected to each support strip, wherein
   a surface of the first elastic connection layer facing away from the plurality of support strips includes at least one first groove; and
   at least one first groove is disposed between two adjacent support strips.

2. The support backplate according to claim 1, wherein in the first direction, a first distance between surfaces facing away from the first elastic connection layer of two adjacent support strips of the plurality of support strips is less than or equal to a second distance between surfaces thereof facing the first elastic connection layer.

3. The support backplate according to claim 2, wherein each support strip of the two adjacent support strips has a first surface perpendicular to a thickness direction of the support strip and facing away from the first elastic connection layer; and
    areas of first sections of the support strip parallel to the first plane progressively decrease in a third direction pointing from the first surface to the first elastic connection layer.

4. The support backplate according to claim 3, wherein a second section of the support strip parallel to a second plane is in a trapezoidal shape or a triangular shape, the second plane is parallel to the thickness direction of the support strip and the first direction.

5. The support backplate according to claim 1, wherein the first elastic connection layer extends into a gap between two adjacent support strips.

6. The support backplate according to claim 1, wherein a material of the first elastic connection layer includes at least one of organic silica gel, thermoplastic elastomer or polyvinyl chloride.

7. The support backplate according to claim 1, wherein the second elastic connection layer extends into a gap between two adjacent support strips.

8. The support backplate according to claim 7, wherein a surface of the second elastic connection layer facing the first elastic connection layer includes at least one second groove;
    the first elastic connection layer includes at least one through-hole, each through-hole being communicated with a respective one of the at least one second groove; and
    at least one second groove is disposed between two adjacent support strips.

9. The support backplate according to claim 1, wherein a material of the second elastic connection layer includes at least one of organic silica gel, thermoplastic elastomer or polyvinyl chloride.

10. The support backplate according to claim 1, further comprising a first support sub-plate disposed at a side of the plurality of support strips in the first direction; wherein the first elastic connection layer is further directly connected to the first support sub-plate.

11. The support backplate according to claim 10, further comprising a second support sub-plate disposed at an opposite side of the plurality of support strips in the first direction; wherein
    the first elastic connection layer is further directly connected to the second support sub-plate.

12. The support backplate according to claim 11, wherein the support strip has a first surface perpendicular to the thickness direction and facing away from the first elastic connection layer, the first support sub-plate has a second surface perpendicular to a thickness direction thereof and facing away from the first elastic connection layer, and the second support sub-plate has a third surface perpendicular to a thickness direction thereof and facing away from the first elastic connection layer; and
    the first surface, the second surface, and the third surface are in a same plane.

13. The support backplate according to claim 11, wherein the second elastic connection layer is further directly connected to the first support sub-plate and/or the second support sub-plate.

14. The support backplate according to claim 10, wherein the plurality of support strips include at least two support strip groups, each support strip group including at least one support strip; and
    the support backplate further comprises a third support sub-plate disposed between any two adjacent support strip groups; wherein
    the first elastic connection layer is further directly connected to the third support sub-plate.

15. A foldable display apparatus, comprising:
    a display panel having a bendable portion; and
    the support backplate according to claim 1 disposed on a side of the display panel opposite to a light exit side thereof, a bending direction of the display panel being parallel to the first direction; wherein
    an orthogonal projection of the bendable portion on the first plane overlaps an orthogonal projection of the support strip on the first plane.

16. The foldable display apparatus according to claim 15, wherein the plurality of support strips are closer to the display panel than the first elastic connection layer; and
    in the first direction, a first distance between surfaces facing away from the first elastic connection layer of two adjacent support strips of the plurality of support strips is less than or equal to a second distance between surfaces thereof facing the first elastic connection layer.

17. A method for manufacturing the support backplate according to claim 1, the method comprising:
    providing a first carrier film and a second carrier film;
    arranging the plurality of support strips on the first carrier film at intervals in the first direction;
    forming the first elastic connection layer on a side of the plurality of support strips facing away from the first carrier film, the first elastic connection layer being directly connected to each support strip, wherein forming the first elastic connection layer includes forming the first elastic connection layer extending into a gap between two adjacent support strips;
    forming at least one first groove on a surface of the first elastic connection layer facing away from the plurality of support strips, at least one first groove being located between two adjacent support strips; and
    separating the first carrier film from the plurality of support strips;
    placing the plurality of support strips connected through the first elastic connection layer on the second carrier film;
    forming the second elastic connection layer on the side of the plurality of support strips facing away from the first elastic connection layer, the second elastic connection layer being directly connected to each support strip; and
    separating the second carrier film from the plurality of support strips to obtain the support backplate.

* * * * *